United States Patent
Kato et al.

(10) Patent No.: US 9,735,167 B2
(45) Date of Patent: Aug. 15, 2017

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Tatsuya Kato, Yokkaichi (JP); Fumitaka Arai, Yokkaichi (JP); Satoshi Nagashima, Yokkaichi (JP); Katsuyuki Sekine, Yokkaichi (JP); Yuta Watanabe, Yokkaichi (JP); Keisuke Kikutani, Yokkaichi (JP); Atsushi Murakoshi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 47 days.

(21) Appl. No.: 14/840,345

(22) Filed: Aug. 31, 2015

(65) Prior Publication Data

US 2017/0012050 A1    Jan. 12, 2017

Related U.S. Application Data

(60) Provisional application No. 62/189,029, filed on Jul. 6, 2015.

(51) Int. Cl.
    *H01L 27/11529*      (2017.01)
    *H01L 27/11556*      (2017.01)
    (Continued)

(52) U.S. Cl.
    CPC .. *H01L 27/11556* (2013.01); *H01L 21/76885* (2013.01); *H01L 23/528* (2013.01);
    (Continued)

(58) Field of Classification Search
    CPC .......... H01L 27/1157; H01L 27/11573; H01L 27/11524; H01L 23/5226; H01L 27/11568;
    (Continued)

(56) References Cited

U.S. PATENT DOCUMENTS 7,539,056 B2 *   5/2009   Katsumata ......... G11C 16/0483
                                                     365/185.18
7,847,334 B2 *   12/2010   Katsumata ............ H01L 21/764
                                                     257/314

(Continued)

FOREIGN PATENT DOCUMENTS

| | | | |
|---|---|---|---|
| JP | 2013-65707 A | 4/2013 |
| JP | 2014-170599 A | 9/2014 |
| JP | 2014-187176 A | 10/2014 |

*Primary Examiner* — Bac Au
(74) *Attorney, Agent, or Firm* — Oblon, McClelland, Maier & Neustadt, L.L.P.

(57) ABSTRACT

A semiconductor memory device according to one embodiment, includes a plurality of first interconnects extending in a first direction and arrayed along a second direction crossing the first direction, a plurality of semiconductor pillars arrayed in a row along the first direction in each of spaces among the first interconnects and extending in a third direction crossing the first direction and the second direction, a first electrode disposed between one of the semiconductor pillars and one of the first interconnects, a first insulating film disposed between the first electrode and one of the first interconnects, a first insulating member disposed between the semiconductor pillars in the first direction and extending in the third direction and opposed the first interconnects not via the first insulating film.

16 Claims, 16 Drawing Sheets

(51) Int. Cl.

| | | |
|---|---|---|
| *H01L 23/528* | (2006.01) | |
| *H01L 27/11548* | (2017.01) | |
| *H01L 23/522* | (2006.01) | |
| *H01L 27/11521* | (2017.01) | |
| *H01L 27/11517* | (2017.01) | |
| *H01L 27/11578* | (2017.01) | |
| *H01L 27/1157* | (2017.01) | |
| *H01L 27/11568* | (2017.01) | |
| *H01L 21/768* | (2006.01) | |
| *H01L 27/11573* | (2017.01) | |
| *H01L 27/11524* | (2017.01) | |
| *H01L 27/24* | (2006.01) | |
| *H01L 27/105* | (2006.01) | |
| *H01L 27/11551* | (2017.01) | |

(52) U.S. Cl.
 CPC ...... *H01L 23/5226* (2013.01); *H01L 27/1052* (2013.01); *H01L 27/1157* (2013.01); *H01L 27/11517* (2013.01); *H01L 27/11521* (2013.01); *H01L 27/11524* (2013.01); *H01L 27/11529* (2013.01); *H01L 27/11548* (2013.01); *H01L 27/11551* (2013.01); *H01L 27/11568* (2013.01); *H01L 27/11573* (2013.01); *H01L 27/11578* (2013.01); *H01L 27/2481* (2013.01)

(58) Field of Classification Search
 CPC ......... H01L 27/11548; H01L 27/11529; H01L 27/11551; H01L 27/11578; H01L 21/76885; H01L 27/1052; H01L 27/11517; H01L 27/1152
 See application file for complete search history.

(56) References Cited

U.S. PATENT DOCUMENTS

| | | | | |
|---|---|---|---|---|
| 7,936,004 | B2* | 5/2011 | Kito | H01L 21/8221 257/324 |
| 8,372,720 | B2* | 2/2013 | Fukuzumi | G11C 16/0483 257/326 |
| 8,598,643 | B2* | 12/2013 | Kawasaki | H01L 27/11582 257/296 |
| 8,649,217 | B2 | 2/2014 | Kuniya et al. | |
| 2010/0112769 | A1* | 5/2010 | Son | H01L 21/8221 438/261 |
| 2010/0155818 | A1* | 6/2010 | Cho | H01L 27/11578 257/324 |
| 2012/0206961 | A1* | 8/2012 | Kito | G11C 16/0483 365/185.2 |
| 2014/0061750 | A1* | 3/2014 | Kwon | H01L 27/1052 257/314 |
| 2014/0247671 | A1 | 9/2014 | Ito et al. | |
| 2014/0286095 | A1 | 9/2014 | Hishida et al. | |

* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S Provisional Patent Application 62/189,029, filed on Jul. 6, 2015; the entire contents of which are incorporated herein by reference.

FIELD

Embodiments described herein relate generally to a semiconductor memory device and a method for manufacturing the same.

BACKGROUND

In a NAND flash memory, an integration degree of memory cells has been increased through shrinking of a plane structure to reduce bit cost. In recent years, in order to further improve the integration degree of memory cells, a technique for stacking the memory cells in an up-down direction has been proposed. However, even in such a stacked type semiconductor memory device, it is desired to highly integrate a plane structure.

DETAILED DESCRIPTION

A semiconductor memory device according to one embodiment, includes a plurality of first interconnects extending in a first direction and arrayed along a second direction crossing the first direction, a plurality of semiconductor pillars arrayed in a row along the first direction in each of spaces among the first interconnects and extending in a third direction crossing the first direction and the second direction, a first electrode disposed between one of the semiconductor pillars and one of the first interconnects, a first insulating film disposed between the first electrode and one of the first interconnects, and a first insulating member disposed between the semiconductor pillars in the first direction, extending in the third direction and opposed the first interconnects not via the first insulating film.

Embodiments of the invention are described below with reference to the drawings.

First Embodiment

First, a first embodiment is described.

Figure 1:
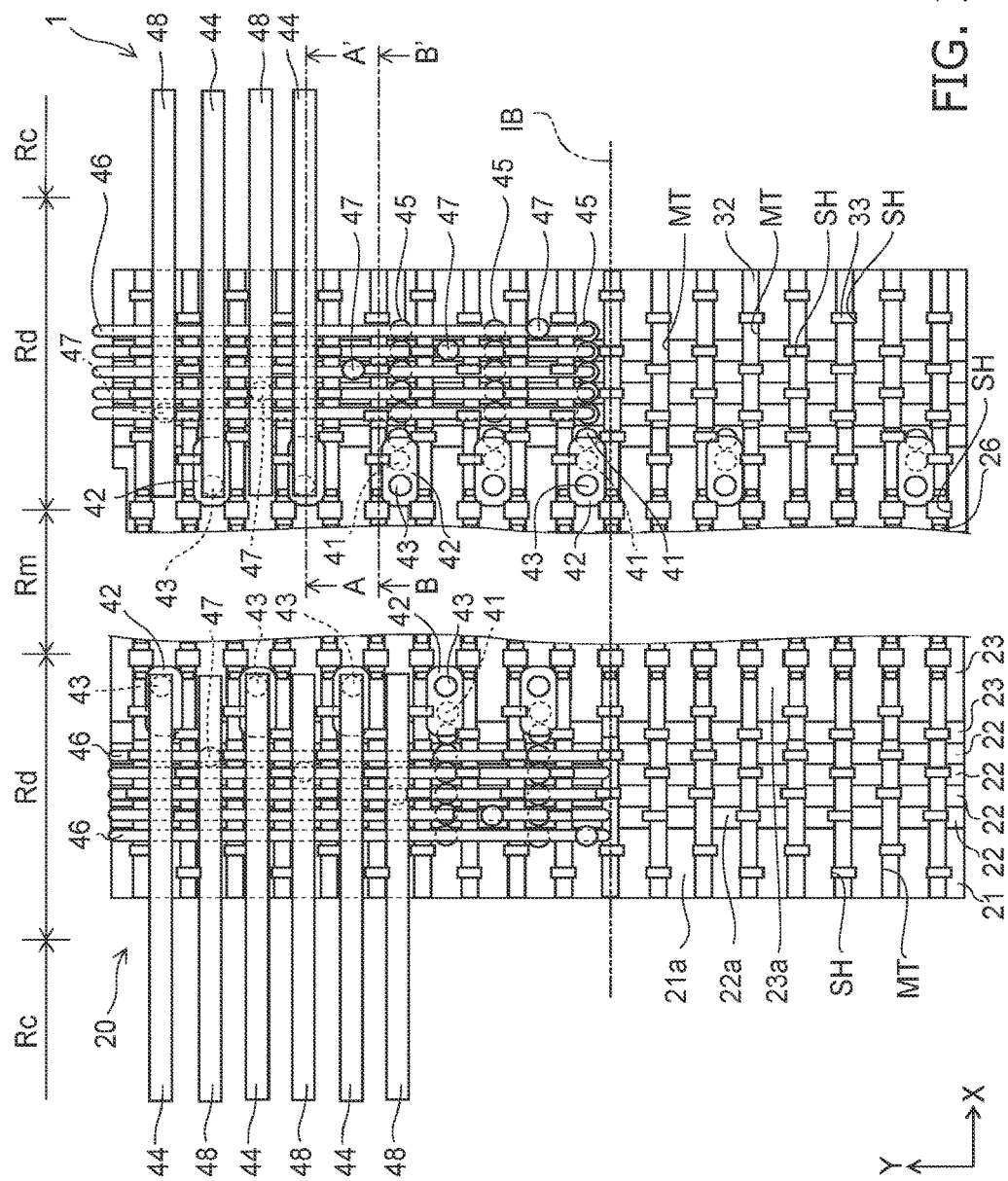
FIG. 1 is a plan view showing a semiconductor memory device according to a first embodiment.

FIG. 1 is a plan view showing a semiconductor memory device according to the embodiment.

Figure 2:
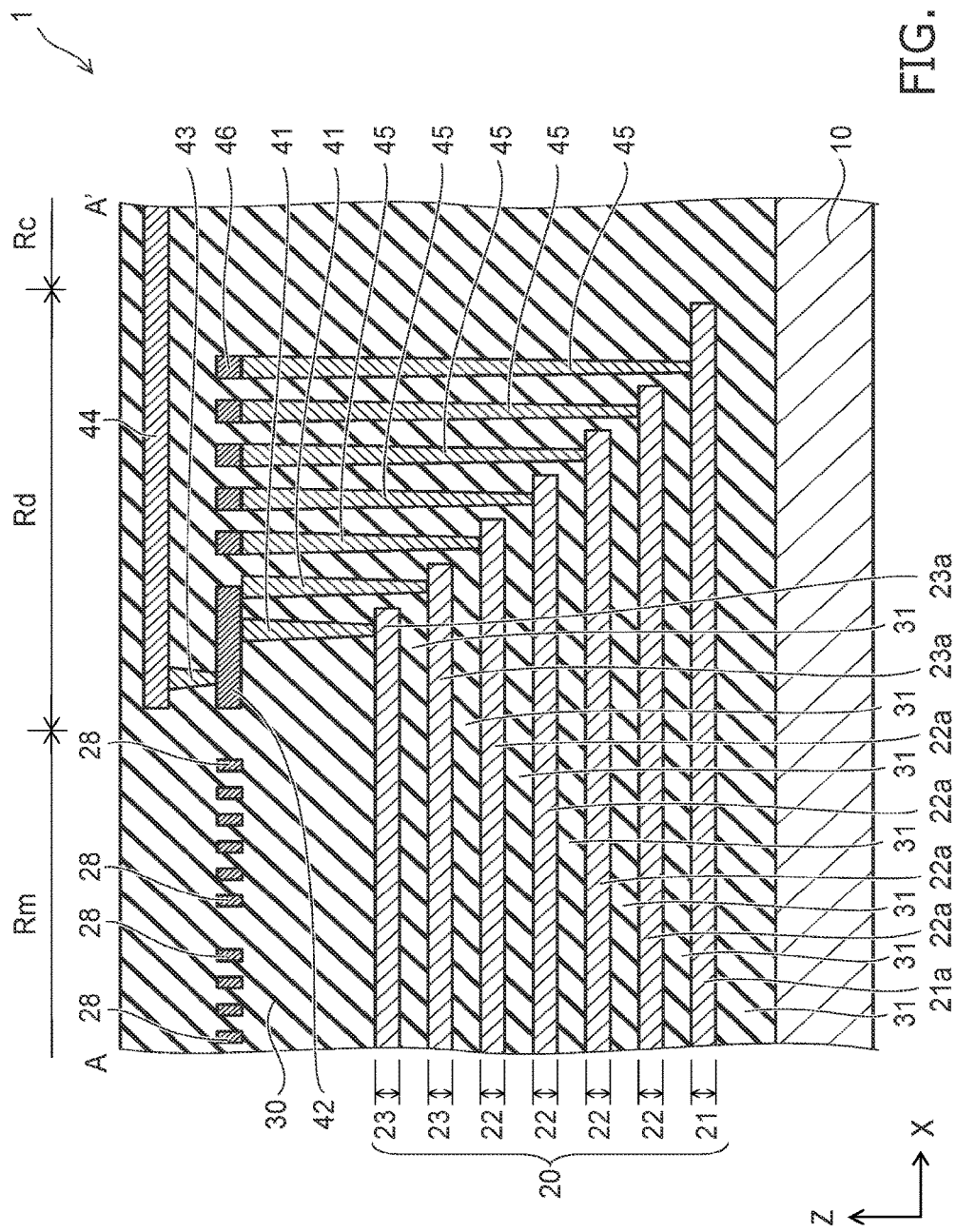
FIG. 2 is a sectional view taken along line A-A' in FIG. 1.

FIG. 2 is a sectional view taken along line A-A' in FIG. 1.

Figure 3:
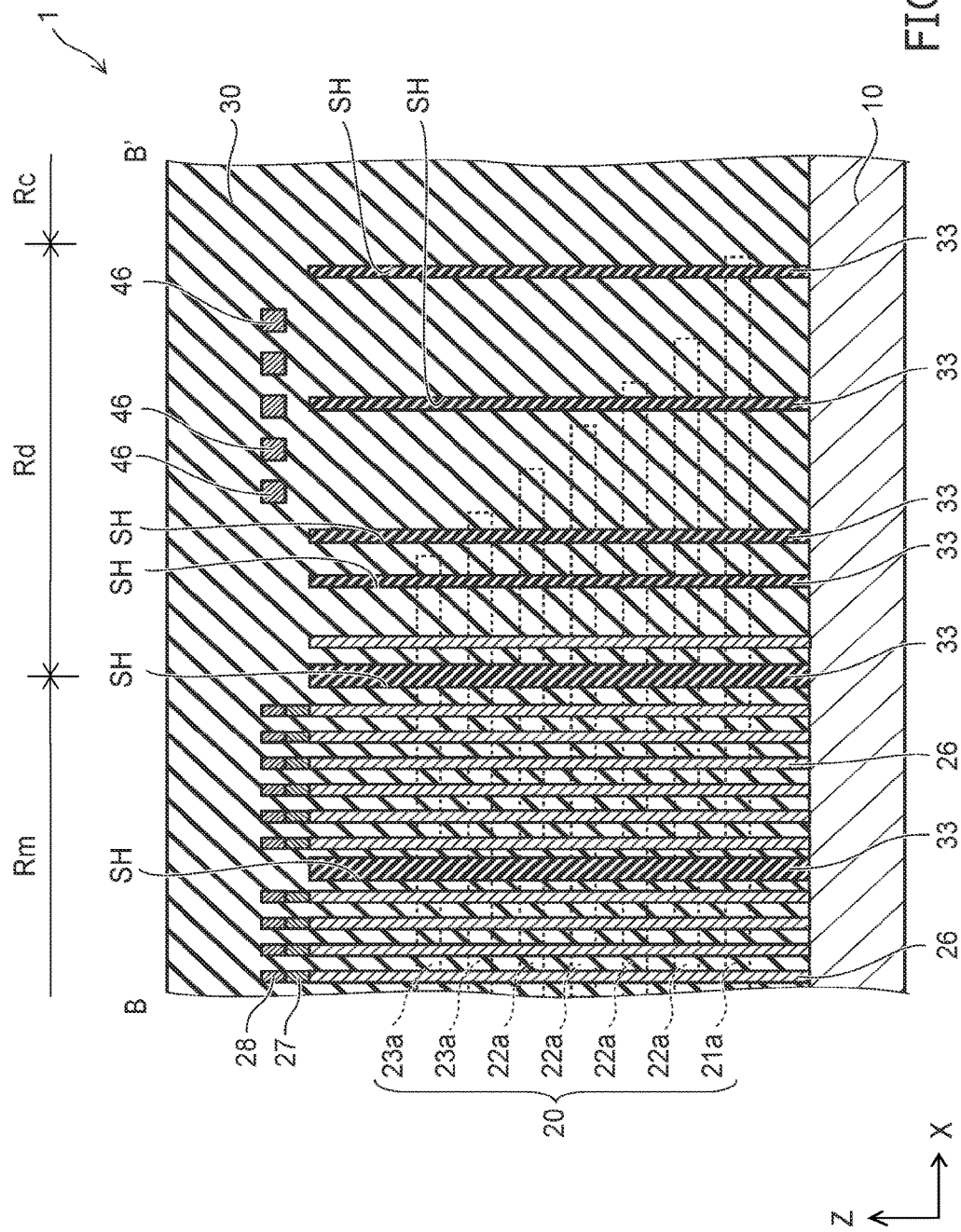
FIG. 3 is a sectional view taken along line B-B' in FIG. 1.

FIG. 3 is a sectional view taken along line B-B' in FIG. 1.

Figure 4A:
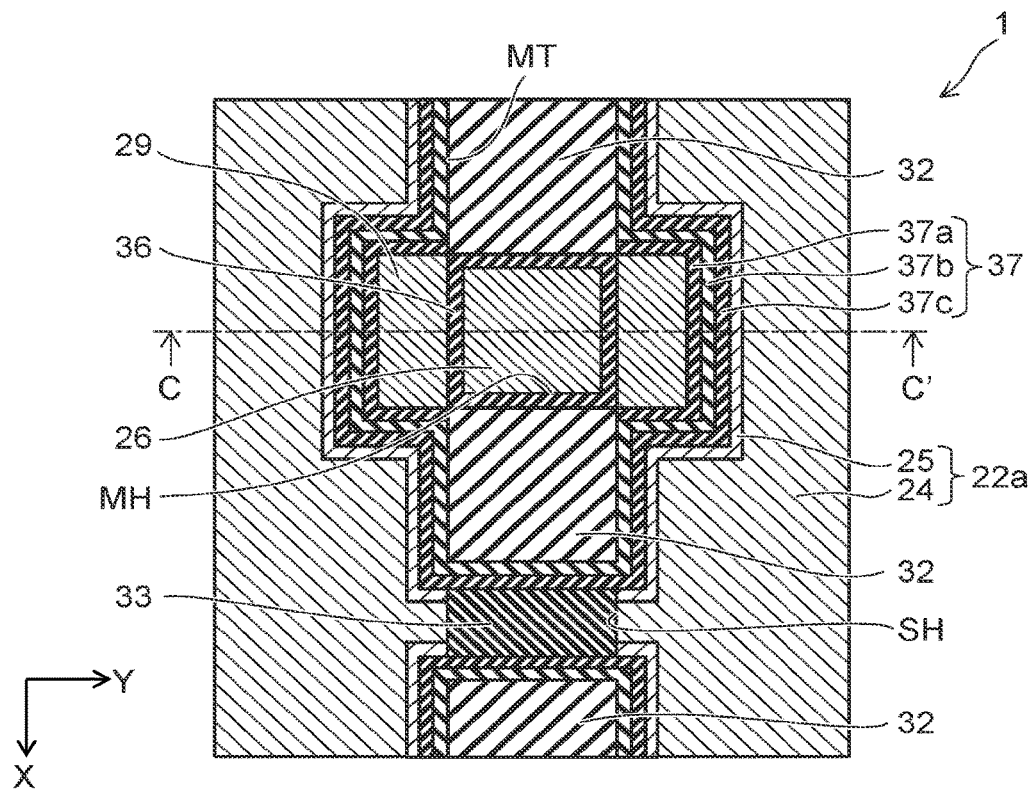
FIGS. 4A and 4B are sectional views showing the semiconductor memory device according to the first embodiment.
Figure 4B:
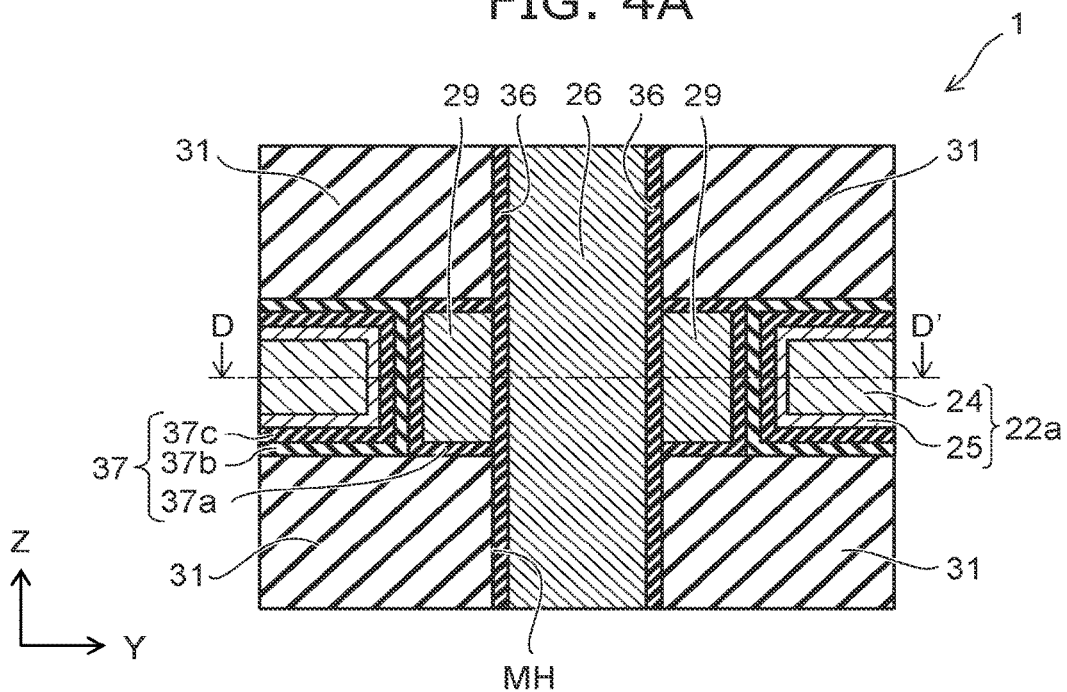

FIGS. 4A and 4B are sectional views showing the semiconductor memory device according to the embodiment. FIG. 4B shows a cross section taken along line C-C' in FIG. 4A. FIG. 4A shows a cross section taken along line D-D' in FIG. 4B.

Note that, in FIGS. 1 to 3, for convenience of illustration, only a part of a plurality of members is shown and the remaining part is omitted. For example, in FIG. 1, in an upper part of the figure, components in an upper layer (e.g., upper layer interconnects 44 and 48) are shown on the top surface. In the middle of the figure, the components in the upper layer are omitted and components in an intermediate layer (e.g., intermediate interconnects 42 and 46) are shown on the top surface. In a lower part of the figure, the components in the upper layer and the intermediate layer are omitted and components in a lower layer (e.g., a stacked body 20) are shown on the top surface. Components seen from the upward direction are indicated by solid lines. Components in the immediately below stage hidden by the components are indicated by broken lines. Components below the components are omitted. The same applies to FIGS. 14 and 15 referred to below.

First, the schematic configuration of the semiconductor memory device according to the embodiment is described.

As shown in FIGS. 1 to 3, a silicon substrate 10 is provided in a semiconductor memory device 1 according to the embodiment.

In the following description, for convenience of description, in the specification, an XYZ orthogonal coordinate system is adopted. Two directions parallel to the upper surface of the silicon substrate 10 and orthogonal to each other are referred to as "X-direction" and "Y-direction". A direction perpendicular to the upper surface is referred to as "Z-direction".

In the semiconductor memory device 1, a memory region Rm, interconnect lead regions Rd, and peripheral circuit regions Rc are set. In the memory region Rm, a large number of memory cells are disposed three-dimensionally. Note that, in FIG. 1, illustration of the memory region Rm is omitted. The interconnect lead regions Rd are disposed on both sides in the X-direction of the memory region Rm. The peripheral circuit regions Rc are disposed around the memory region Rm and the interconnect lead regions Rd. Peripheral circuits are formed in the peripheral circuit regions Rc. The peripheral circuits input signals to and output signals from memory cells to thereby operate the memory cells. The interconnect lead regions Rd are regions for drawing out, from the memory region Rm, interconnects extending in the X-direction and connecting the interconnects to the peripheral circuits.

The memory region Rm and the interconnect lead regions Rd are sectioned into a plurality of blocks arrayed along the Y-direction. In FIG. 1, boundary lines IB among the blocks are indicated by alternate long and two short dashes lines. The same applies to FIG. 14 referred to below.

On the silicon substrate 10, for example, one lower selection gate interconnect layer 21, a plurality of word line interconnect layers 22, and one or more, for example, two upper selection gate interconnect layers 23 are spaced from one another via interlayer insulating films 31 and stacked to configure the stacked body 20. In the memory region Rm, all layers of the stacked body 20 are disposed. In the interconnect lead regions Rd, the shape of the stacked body 20 is a step shape. The stacked body 20 is drawn further to the outer side toward a lower stage. That is, the word line interconnect layers 22 and the upper selection gate interconnect layers 23 are not disposed in regions right above both end portions in the X-direction of the lower selection gate interconnect layer 21. In regions right above both end portions in the X-direction of a certain word line interconnect layer 22, the word line interconnect layers 22 in upper stages of the word line interconnect layer 22 and the upper selection gate interconnect layers 23 are not disposed. In regions right above both end portions in the X-direction of the word line interconnect layers 22 in the top stage, the upper selection gate interconnect layers 23 are not disposed.

In the stacked body 20, a plurality of linear memory trenches MT extending in the X-direction are formed. The memory trenches MT pierce through the stacked body 20 in the Z-direction and reach the silicon substrate 10. The memory trenches MT also pierce through the stacked body 20 in the X-direction. Therefore, the memory trenches MT divide the upper selection gate interconnect layers 23, the word line interconnect layers 22, and the lower selection gate interconnect layer 21.

Portions sandwiched by the memory trenches MT adjacent to each other in the upper selection gate interconnect layers 23 are upper selection gate lines 23a extending in the X-direction. Concerning the word line interconnect layers 22 and the lower selection gate interconnect layer 21, similarly, portions sandwiched by the memory trenches MT are respectively word lines 22a and lower selection gate lines 21a.

In the memory trenches MT, a plurality of silicon pillars 26 are arrayed in rows along the X-direction. Therefore, the lower selection gate lines 21a, the word lines 22a, and the upper selection gate lines 23a are disposed on both sides in the Y-direction of the silicon pillars 26. The shape of the silicon pillars 26 is, for example, a quadratic prism shape extending in the Z-direction. The lower ends of the silicon pillars 26 are connected to the silicon substrate 10. Insulating members 32 made of, for example, silicon oxide are provided among the silicon pillars 26 in the memory trenches MT.

In the memory trenches MT, through-holes SH extending in the Z-direction are discontinuously formed in the X-direction. For example, through-hole SH in one place is formed for every ten silicon pillars 26. The through-holes SH pierce through the stacked body 20 in the Z-direction and reach the silicon substrate 10. In the through-holes SH, insulating members 33 made of, for example, silicon oxide are embedded in the through-holes SH.

The memory region Rm is described.

Bit line plugs 27 are provided on the silicon pillars 26. A plurality of bit lines 28 extending in the Y-direction are provided on the bit line plugs 27. The silicon pillars 26 are connected to the bit lines 28 via the bit line plugs 27. The bit lines 28 are connected to, for example, a sense amplifier of the peripheral circuit. On the stacked body 20, an interlayer insulating film 30 made of, for example, silicon oxide is provided. The bit line plugs 27 and the bit lines 28 are embedded in the interlayer insulating film 30.

FIGS. 4A and 4B are partial sectional views showing small portions including one silicon pillar 26 and the through-hole SH in one place in th semiconductor memory device 1.

As shown in FIGS. 4A and 4B, a tunnel insulating film 36 is provided around the silicon pillar 26 when viewed from the Z-direction. The tunnel insulating film 36 is a film that feeds a tunnel current when a predetermined voltage within a range of a driving voltage of the semiconductor memory device 1 is applied to the tunnel insulating film 36. The tunnel insulating film 36 is, for example, a silicon oxide film of a single layer or a three-layer film consisting of a silicon oxide layer, a silicon nitride layer, and a silicon oxide layer.

A floating gate electrode 29 is provided between the tunnel insulating film 36 and the word line 22a. The floating gate electrode 29 is a conductive member that accumulates electric charges and is formed of, for example, polysilicon (Si).

On a region excluding a region in contact with the tunnel insulating film 36 on the surface of the floating gate electrode 29, a high dielectric constant layer 37a made of a high dielectric constant material such as silicon nitride (SiN), hafnium oxide (HfO$_2$), or aluminum oxide (Al$_2$O$_3$) is provided. In the high dielectric constant layer 37a, metal such as ruthenium (Ru) may be contained. The shape of the high dielectric constant layer 37a is a cup shape surrounding the floating gate electrode 29.

On the other hand, on a side surface on the floating gate electrode 29 side in the word line 22a and the upper surface and the lower surface of the word line 22a, a high dielectric constant layer 37c made of a high dielectric constant material is formed. On the high dielectric constant layer 37c, a silicon oxide layer 37b made of silicon oxide (SiO$_2$) is formed. The shape of the silicon oxide layer 37b and the high dielectric constant layer 37c in a YZ cross section is a C shape including the word line 22a.

Consequently, the high dielectric constant layer 37a, the silicon oxide layer 37b, and the high dielectric constant layer 37c are stacked in this order between the floating gate electrode 29 and the word line 22a. A block insulating film 37 is configured by the high dielectric constant layer 37a, the silicon oxide layer 37b, and the high dielectric constant layer 37c. The block insulating film 37 is a film that does not substantially feed an electric current even if a voltage within the range of the driving voltage of the semiconductor memory device 1 is applied to the block insulating film 37.

In the word line 22a, a main body section 24 made of, for example, tungsten (W) is provided. On the surface of the main body section 24, a barrier metal layer 25 made of, for example, titanium nitride (TiN) is provided. The same applies to the upper selection gate line 23a and the lower selection gate lines 21a. The insulating member 33 is opposed the word lines 22a not via the block insulating film 37. The insulating member 33 is opposed the insulating member 32 via the silicon oxide layer 37b and the high dielectric constant layer 37c, and not via the high dielectric constant layer 37a.

In the semiconductor memory device 1, a transistor including one floating gate electrode 29 is formed in each of intersection portions of the silicon pillars 26 and the word lines 22a. The transistor functions as a memory cell. A NAND string in which a plurality of memory cells are connected in series is connected between the bit lines 28 and the silicon substrate 10.

The interconnect lead region Rd is described.

As shown in FIGS. 1 and 2, contacts 41 are provided on end portions of the upper selection gate lines 23a of the upper selection gate interconnect layers 23. Intermediate interconnects 42 are provided on the contacts 41. Vias 43 are provided on the intermediate interconnects 42. Upper layer interconnects 44 extending in the X-direction are provided on the vias 43. Consequently, the upper selection gate lines 23a are connected to the upper layer interconnects 44 via the contacts 41, the intermediate interconnects 42, and the vias 43. In this way, after being drawn out upward (in the Z-direction) in a route of (the contacts 41—the intermediate interconnects 42—the vias 43), the upper selection gate lines 23a are drawn out in the X-direction by the upper layer interconnects 44 and connected to the peripheral circuits. Therefore, the upper selection gate lines 23a can be driven independently from one another.

Contacts 45 are provided on one end portions of the word lines 22a of the word line interconnect layers 22. End portions where the contacts 45 are provided among both end portions in the X-direction of the word lines 22a are alternate in a continuously arrayed plurality of word lines 22a. That is, concerning two word lines 22a adjacent to each other, the contacts 45 are provided on end portions different from each other in the X-direction. Intermediate interconnects 46 extending in the Y-direction are provided on the contacts 45. Consequently, every other word lines 22a are connected to the intermediate interconnects 46 via the contacts 45 in common. The same applies to the lower selection gate interconnect layer 21. The intermediate interconnects 46 extend in the entire length in the Y-direction in one block and are connected to every other word lines 22a among the word lines 22a belonging to the word line interconnect layers 22. Vias 47 are provided on the intermediate interconnects 46. Upper layer interconnects 48 extending in the X-direction are provided on the vias 47. Consequently, in the blocks, all the word lines 22a belonging to the word line interconnect layers 22 are connected to one upper layer interconnect 48 via the contacts 45, the intermediate interconnects 46, and the vias 47. In this way, after being respectively drawn out upward (in the Z-direction) by the contacts 45, every other word lines 22a belonging to a certain word line interconnect layer 22 are bound into one by the intermediate interconnects 46 extending in the Y-direction. Consequently, a plurality of word lines 22a belonging to a certain word line interconnect layer 22 are connected in a pair of comb shapes disposed in positions where the comb shapes mesh with each other. After being further drawn out upward by the vias 47, the intermediate interconnects 46 are drawn out in the X-direction by the upper layer interconnects 48 and connected to the peripheral circuits. Similarly, in the blocks, every other lower selection gate lines 21a are bound by the contacts 45 and the intermediate interconnects 46 and then drawn out in the X-direction by one upper layer interconnect 48 and connected to the peripheral circuits.

On the other hand, the intermediate interconnects 46 do not extend exceeding the boundary lines IB of the blocks. The word lines 22a belonging to different blocks are not connected. The lower selection gate lines 21a belonging to different blocks are not connected. Therefore, the lower selection gate interconnect layer 21 and the word line interconnect layers 22 can be driven for each of the blocks.

As described above, the shape of both end portions in the X-direction of the stacked body 20 is the step shape. Therefore, the contacts 45 connected to end portions in the X-direction of the word line interconnect layers 22 are present further on the outer side, that is, a side farther from the memory region Rm than the contacts 41 connected to end portions in the X-direction of the upper selection gate interconnect layers 23. The contacts 45 connected to the end portions in the X-direction of the word line interconnect layers 22, in lower layers among the word line interconnect layers 22, are located further on the outer side. A contact connected to an end portion in the X-direction of the lower selection gate interconnect layer 21 is present further on the outer side than the contacts 45. In other words, the distance between an end portion in the X-direction of the word line interconnect layer 22, in the upper layer of the word line interconnect layers 22 in certain two layers and the silicon pillar 26 closest to the end portion is shorter than the distance between an end portion in the X-direction of the word line interconnect layer 22 in the lower layer and the silicon pillar 26 closest to the end portion.

A manufacturing method for the semiconductor memory device according to the embodiment is described.

FIGS. 5A to 13B are sectional views showing the manufacturing method for the semiconductor memory device according to the embodiment.

Figure 5A:
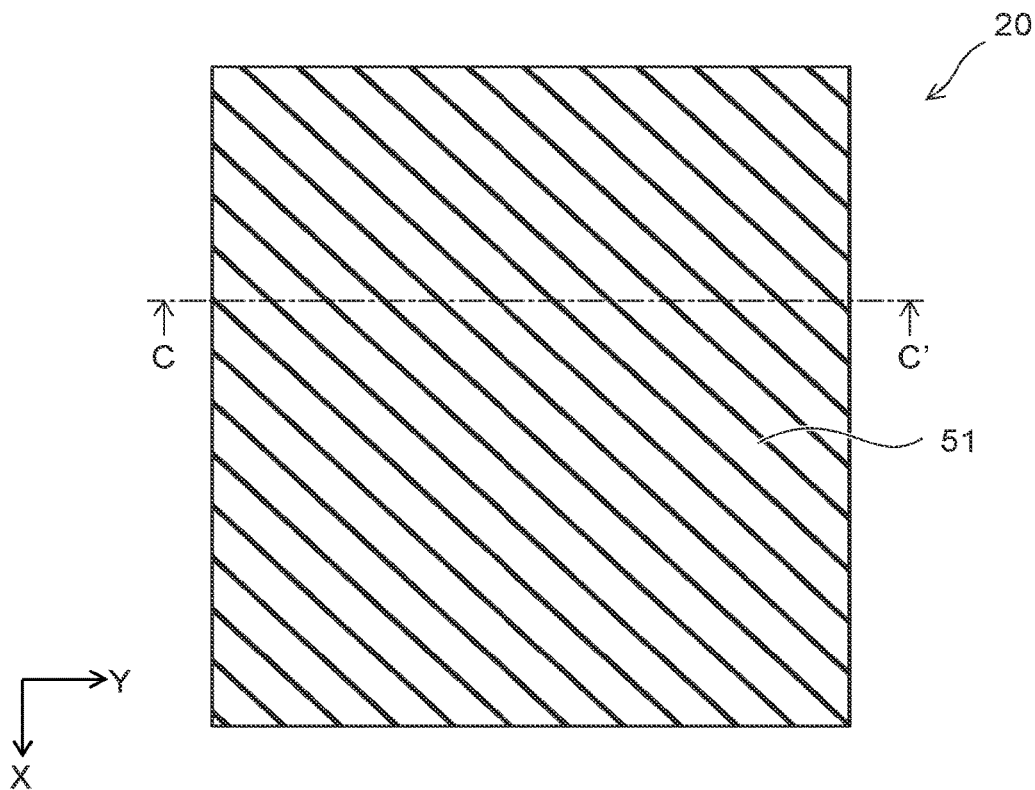
FIGS. 5A to 13B are sectional views showing a manufacturing method for the semiconductor memory device according to the first embodiment.
Figure 5B:
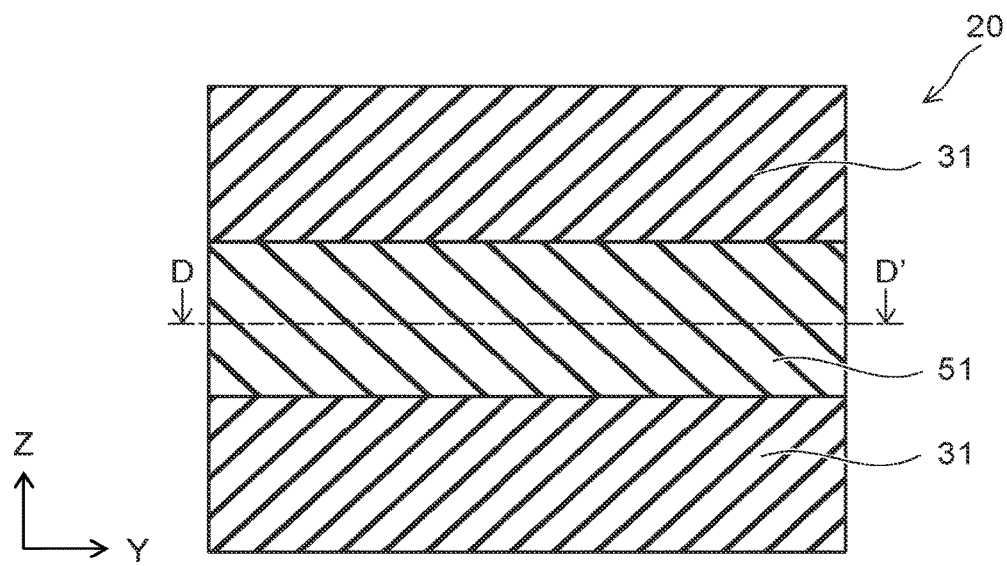

FIG. 5B shows a cross section taken along line C-C' in FIG. 5A. FIG. 5A shows a cross section taken along line D-D' in FIG. 5B. The same applies to FIGS. 6A to 13B.

First, as shown in FIGS. 5A and 5B, the interlayer insulating films 31 and a sacrificial film 51 are alternately formed on the silicon substrate 10 (see FIG. 2) to form the stacked body 20. For example, the interlayer insulating films 31 are formed of silicon oxide. The sacrificial film 51 is formed of silicon nitride.

Figure 6A:
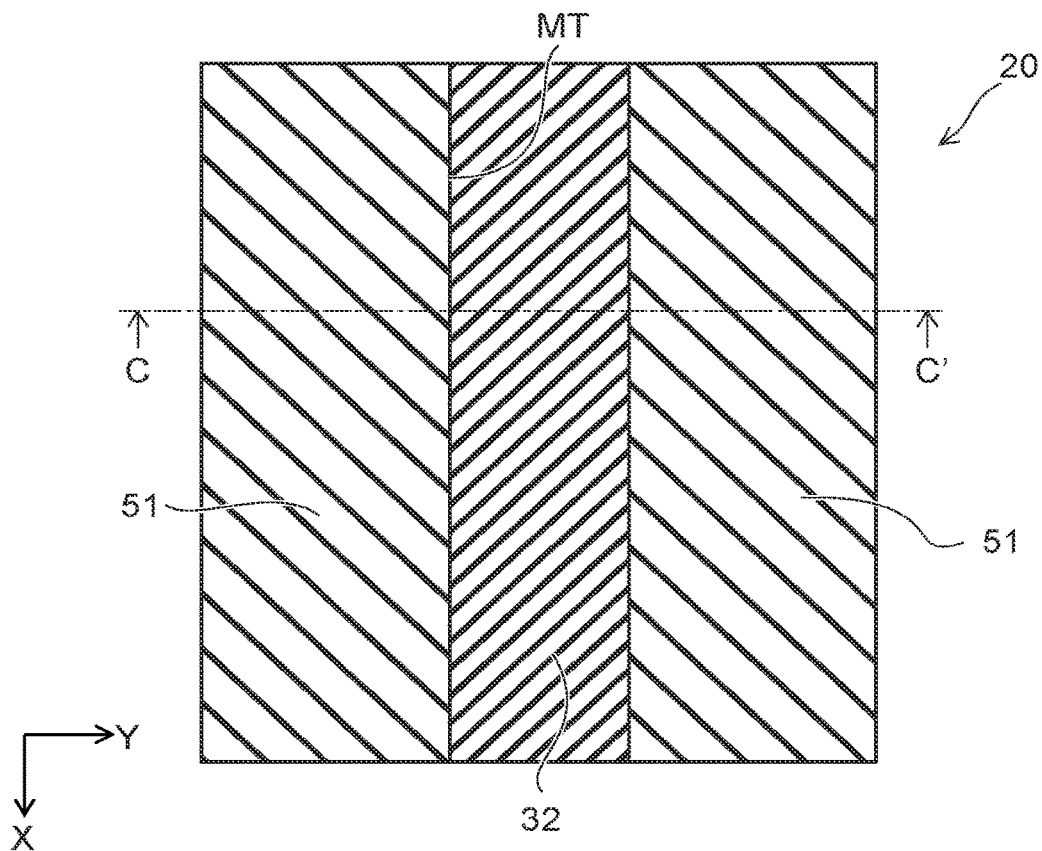
Figure 6B:
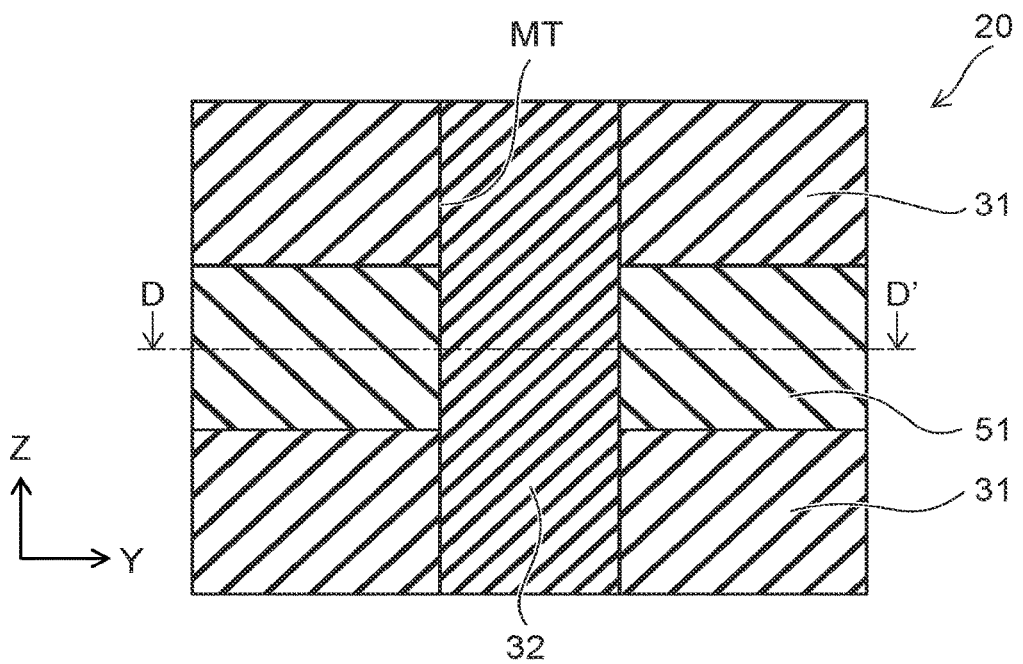

Subsequently, as shown in FIGS. 6A and 6B, a hard mask for MT (not shown in the figure) in a line-and-space shape extending in the X-direction is formed on the stacked body 20 by a lithography method. By applying anisotropic etching such as RIE (Reactive Ion Etching) using the hard mask for MT as a mask, the memory trench MT extending in the X-direction is formed in the stacked body 20. The memory trench MT is made to pierce through the stacked body 20 in the Z-direction to reach the silicon substrate 10 (see FIG. 2). Subsequently, for example, silicon oxide is deposited in the memory trench MT and the insulating member 32 is embedded in the memory trench MT.

Figure 7A:
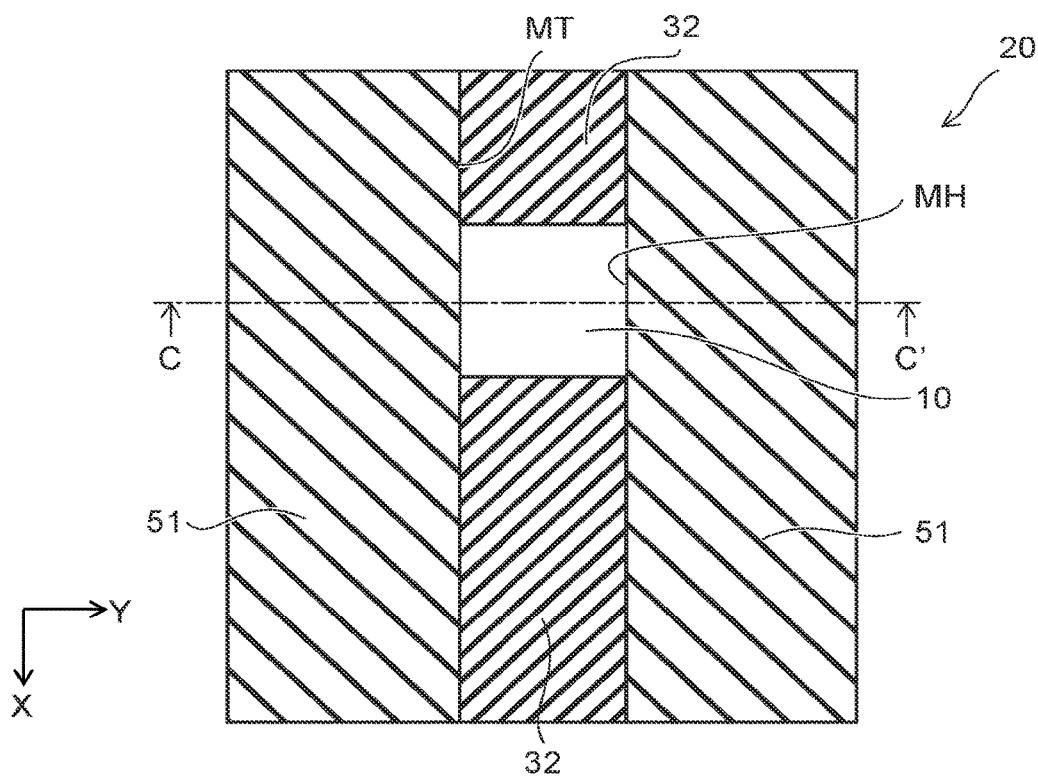
Figure 7B:
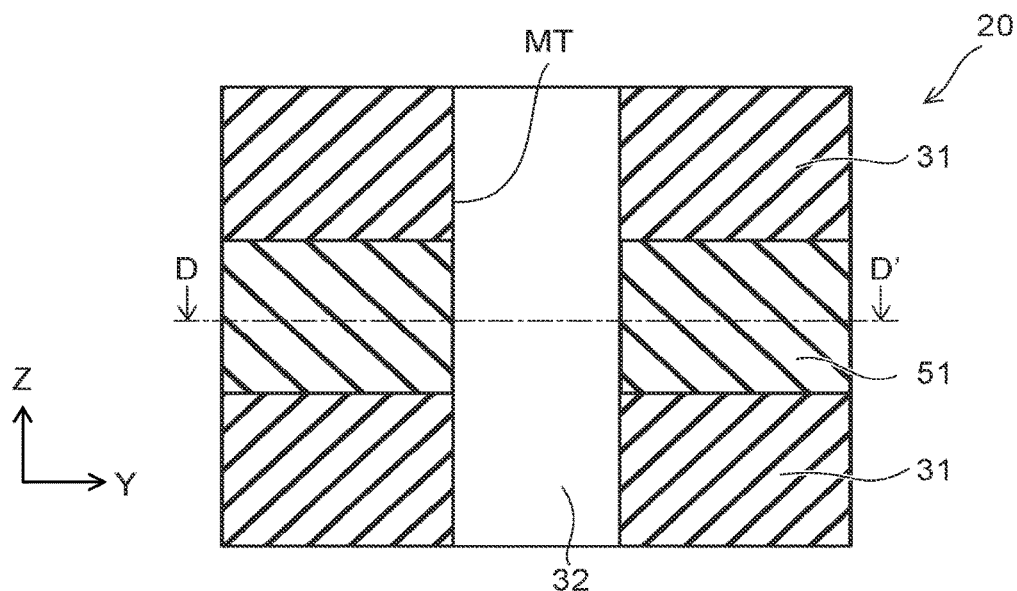

Subsequently, as shown in FIGS. 7A and 7B, a hard mask for AA (not shown in the figure) in a line-and-space shape extending in the Y-direction is formed on the stacked body 20. When viewed from the Z-direction, the hard mask for AA and the hard mask for MT (not shown in the figure) are arrayed in a lattice shape. By applying RIE using the hard mask for AA (not shown in the figure) and the hard mask for MT (not shown in the figure) as masks, a plurality of memory holes MH are formed in the insulating member 32 in a matrix shape. The memory holes MH are made to pierce through the stacked body 20 in the Z-direction to reach the silicon substrate 10.

Figure 8A:
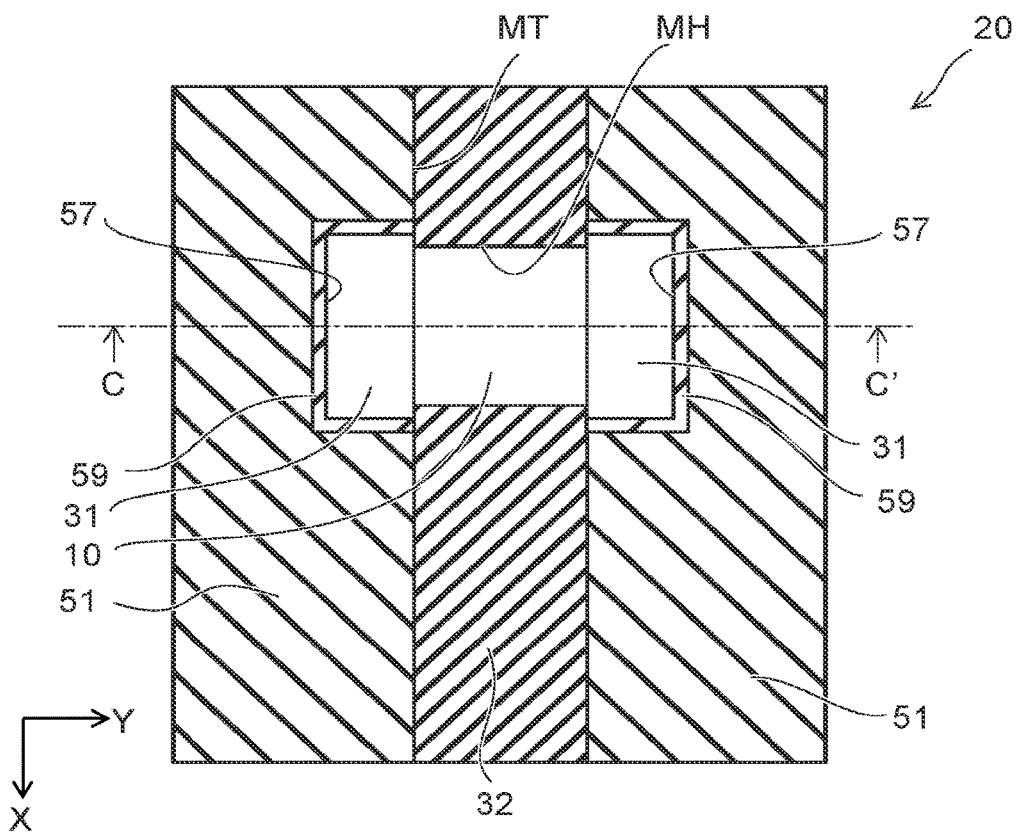
Figure 8B:
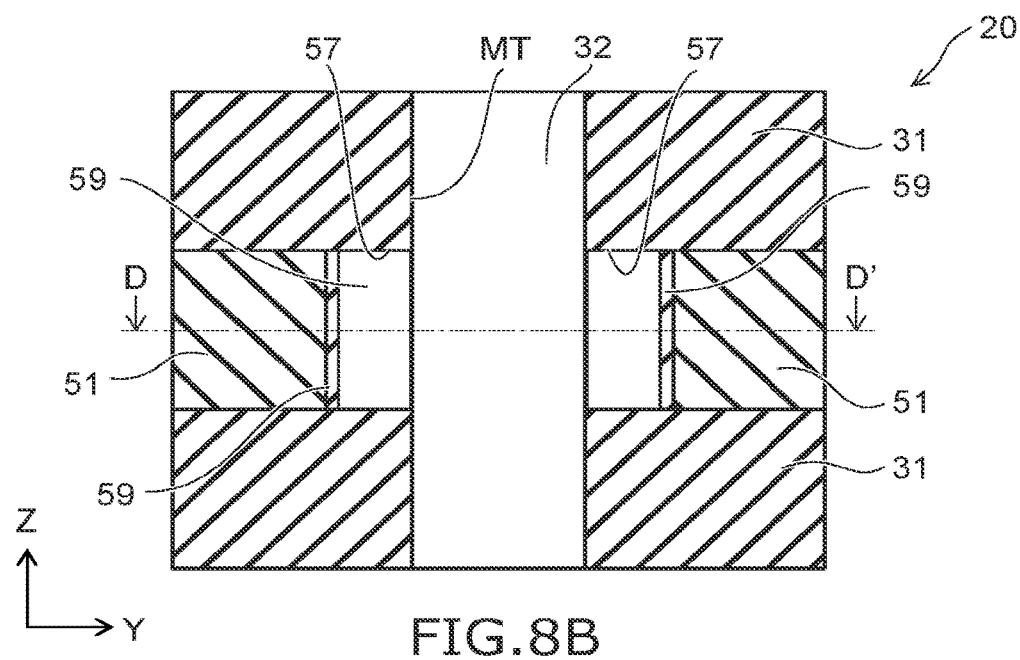

Subsequently, as shown in FIGS. 8A and 8B, by applying wet etching using, for example, hot phosphoric acid via the memory hole MH, the sacrificial film 51 exposed on the side surface of the memory hole MH is etched back to form recessed portions 57 on the side surface of the memory hole MH. At this point, since the insulating member 32 is substantially not etched, the recessed portions 57 are not formed in both sides in the X-direction of the memory hole MH and are formed only on both sides in the Y-direction. The recessed portions 57 in a plurality of stages are arrayed along the Z-direction. Subsequently, by performing oxidization treatment, the sacrificial film 51 exposed on the side surfaces of the recessed portions 57 is oxidized to form cover oxidized films 59.

Figure 9A:
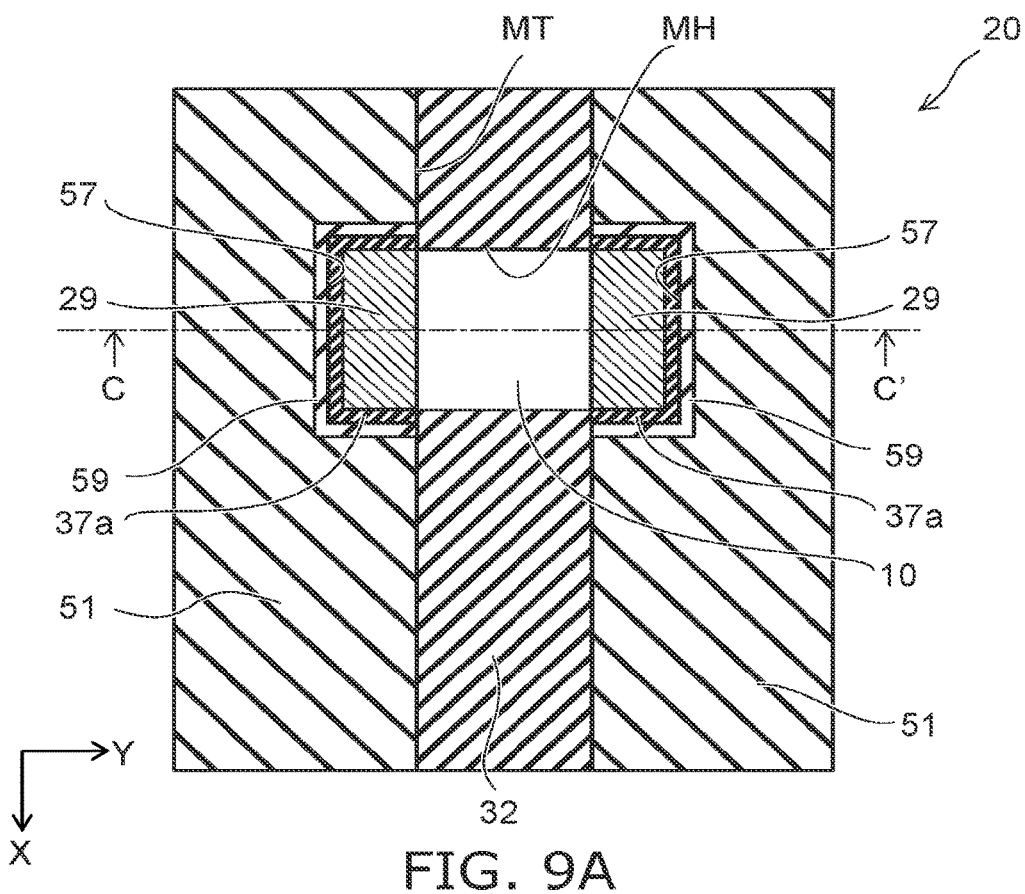
Figure 9B:
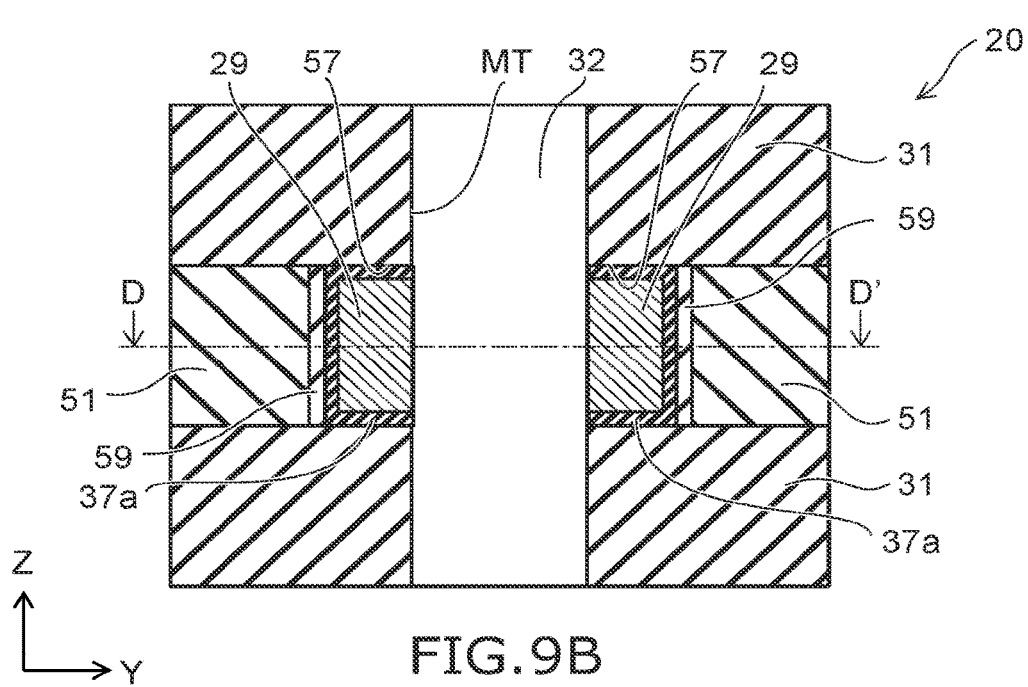

Subsequently, as shown in FIGS. 9A and 9B, by depositing a high dielectric constant material containing metal, high dielectric constant layers 37a are formed on the inner surfaces of the memory holes MH and the recessed portions 57. Subsequently, by depositing silicon, silicon films are formed on the high dielectric constant layers 37a. Subsequently, by applying wet etching using TMY (choline water solution) or isotropic etching such as CDE (chemical dry etching), the silicon films and the high dielectric constant layers 37a are recessed and portions deposited on the outside of the recessed portions 57 in the silicon films and the high dielectric constant layers 37a are removed to leave silicon films and the high dielectric constant layers 37a on the insides of the recessed portions 57. Consequently, the high dielectric constant layers 37a are formed on the inner surfaces of the recessed portions 57 and the floating gate electrodes 29 made of silicon are formed in the recessed portions 57.

Figure 10A:
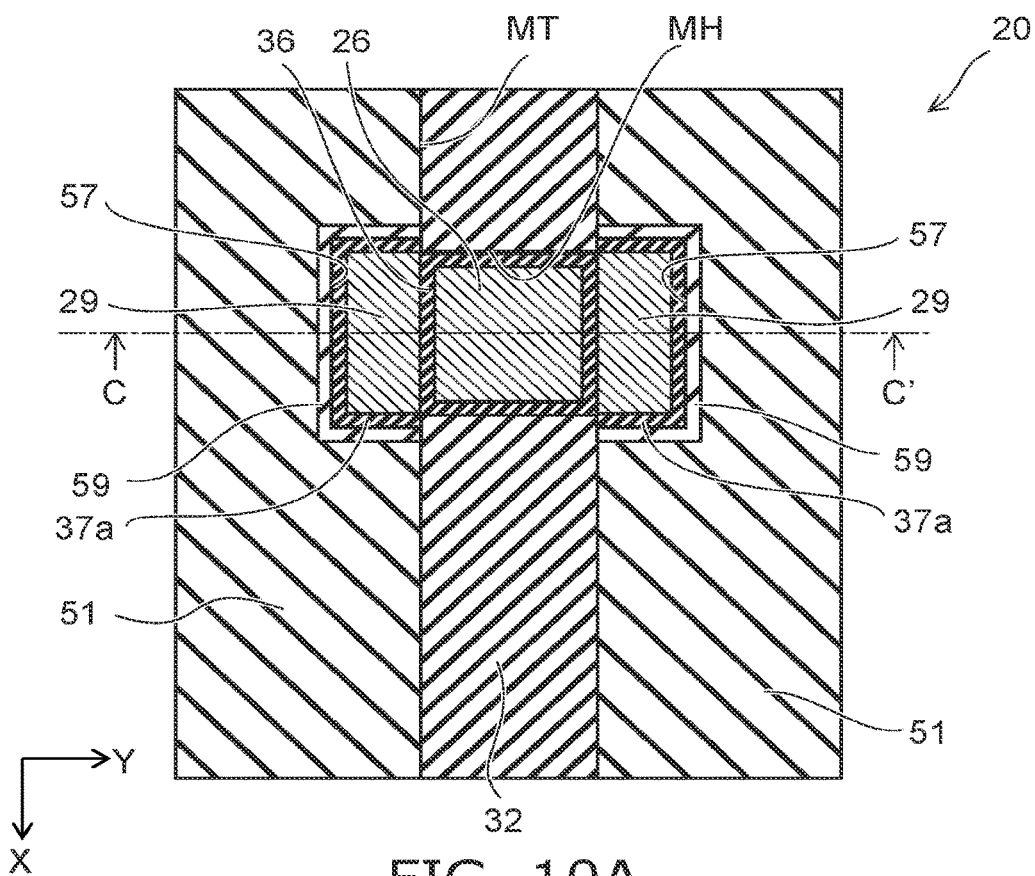
Figure 10B:
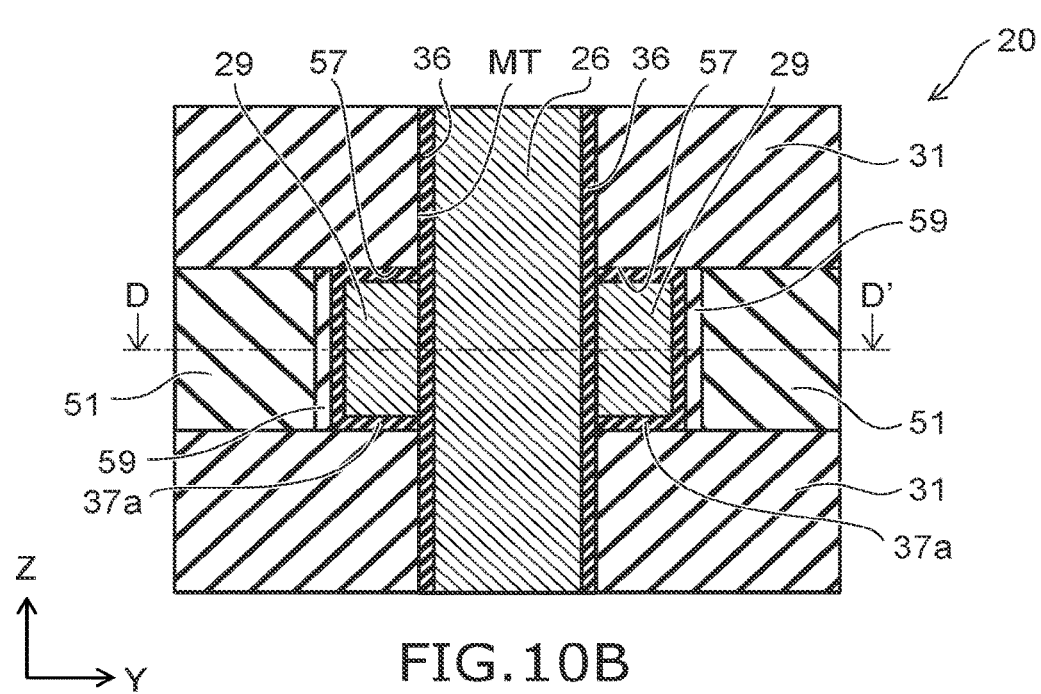

Subsequently, as shown in FIGS. 10A and 10B, for example, silicon oxide is deposited on the inner surfaces of the memory holes MH by, for example, an ALD (Atomic Layer Deposition) method to form the tunnel insulating films 36. Subsequently, cover silicon films are formed on the side surfaces of the tunnel insulating films 36. Subsequently, the cover silicon film and the tunnel insulating film 36 deposited on the bottom surface of the memory hole MH are removed by the RIE method to expose the silicon substrate 10 (see FIG. 2). Subsequently, silicon is deposited in the memory trench MT to embed a body silicon film. The body silicon film is in contact with the silicon substrate 10. The silicon pillar 26 is formed by the cover silicon films and the body silicon film. Subsequently, heat treatment for crystallizing the silicon is applied. In this way, the tunnel insulating films 36 are formed on the inner side surfaces of the memory hole MH. The silicon pillar 26 is formed to be surrounded by the tunnel insulating films 36.

Figure 11A:
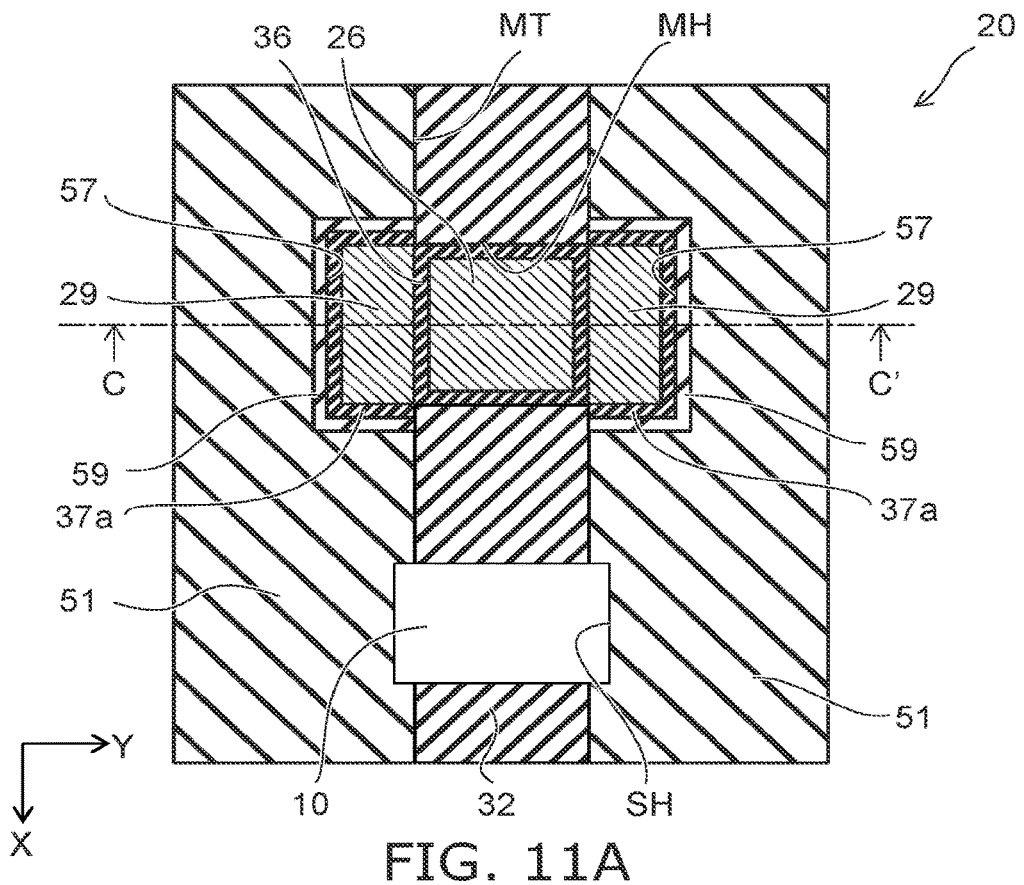
Figure 11B:
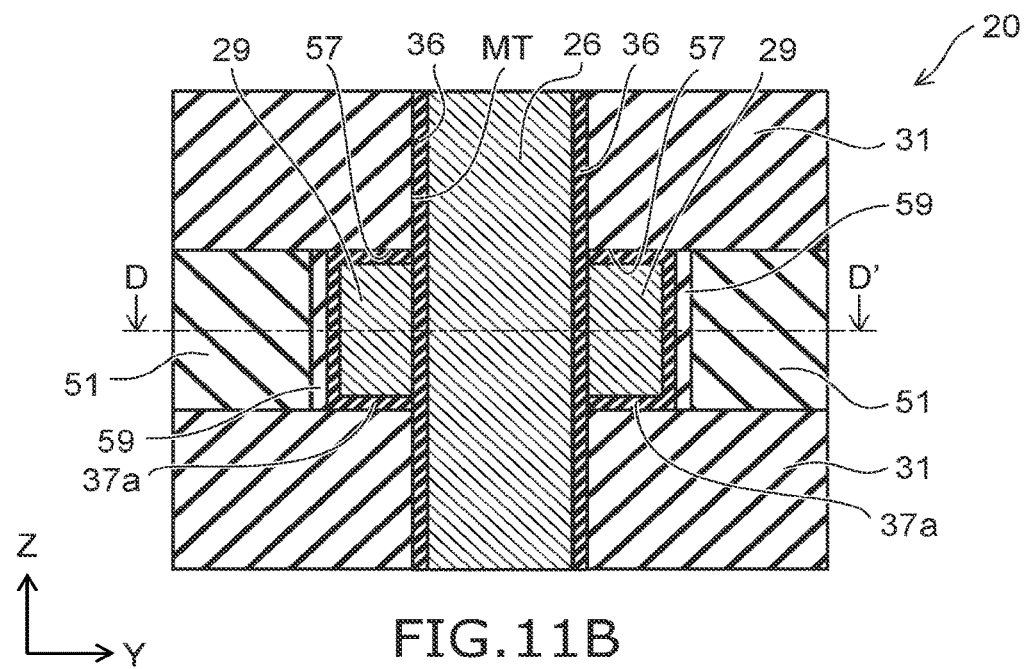

Subsequently, as shown in FIGS. 11A and 11B, the through-hole SH extending in the Z-direction and piercing through the stacked body 20 is formed by the lithography method in a part of a portion where the silicon pillar 26 is not formed in the memory trench MT. The through-hole SH is formed for each fixed number of silicon pillars 26 in the memory trenches MT. The length in the Y-direction of the through-hole SH is set larger than the width of the memory trench MT to protrude both end portions in the Y-direction of the through-hole SH from the memory trench MT. Consequently, on the inner surface of the through-hole SH, the inter-layer insulating films 31 and the sacrificial film 51 are exposed besides the insulating member 32.

Figure 12A:
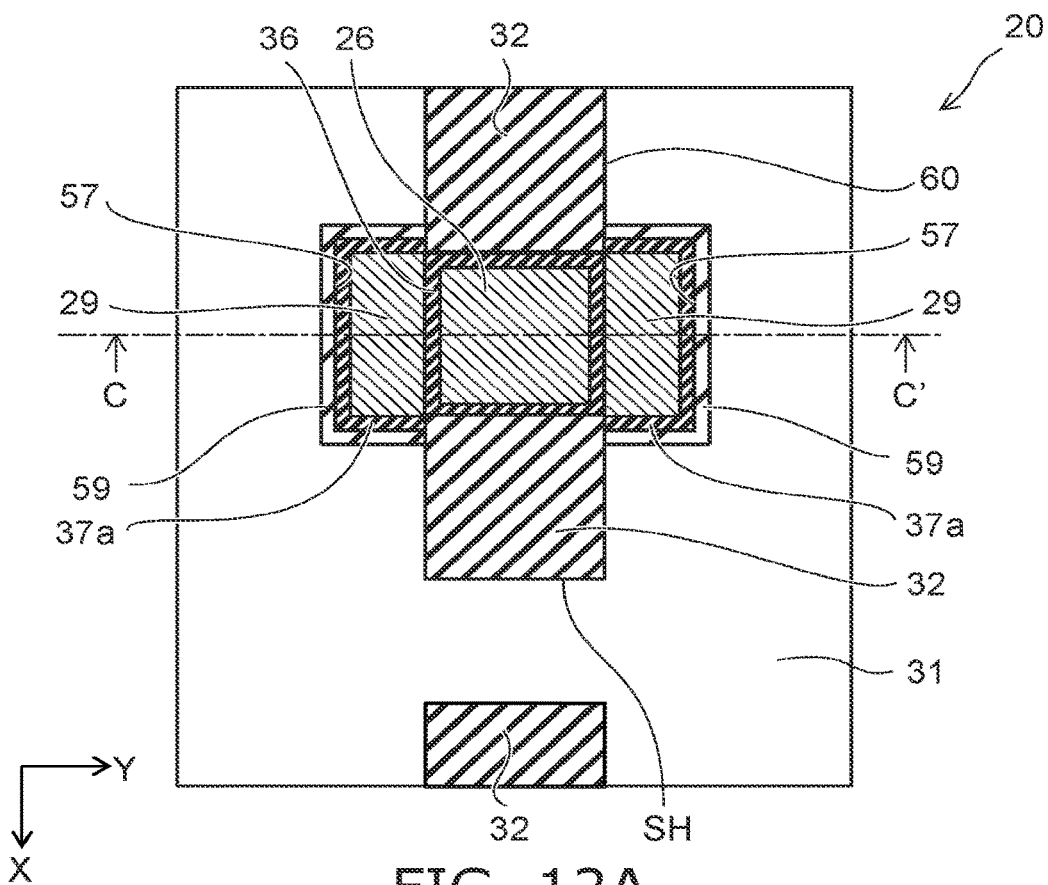
Figure 12B:
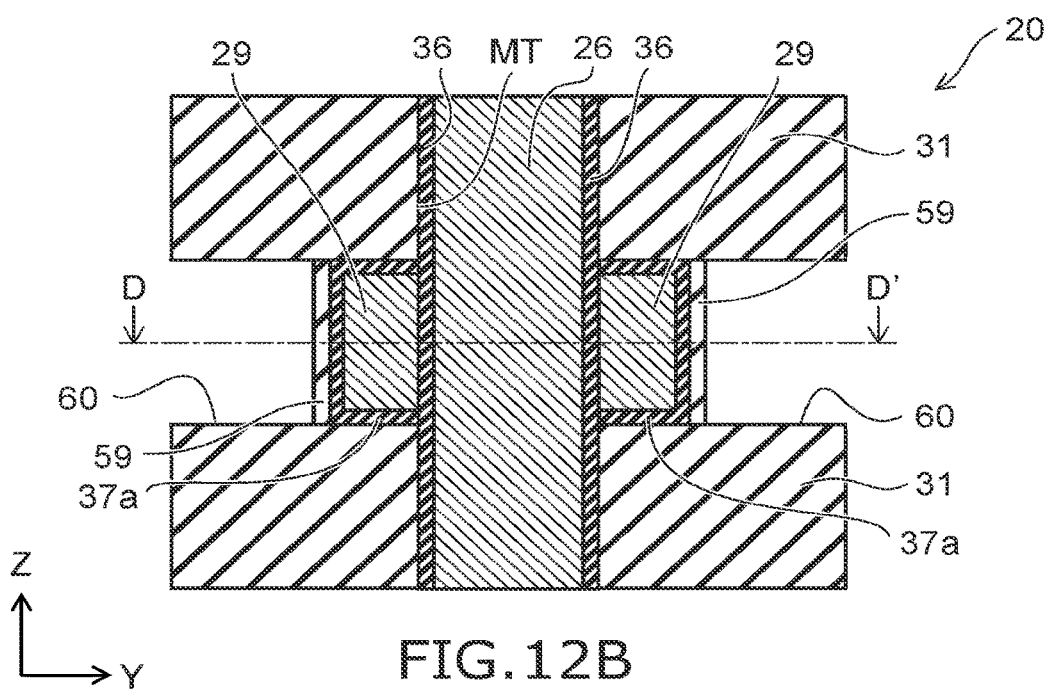

Subsequently, as shown in FIGS. 12A and 12B, wet etching by, for example, hot phosphoric acid is applied using the cover oxide films 59 as etching stoppers. Consequently, the sacrificial film 51 (see FIGS. 11A and 11B) is removed via the through-hole SH. At this point, the interlayer insulating film 31, the insulating member 32, and the cover oxide films 59 made of silicon oxide are substantially not etched. Consequently, a hollow 60 is formed in a space after the removal of the sacrificial film 51. The upper surface and the lower surface of the hollow 60 are configured by the interlayer insulating film 31. The side surface of the hollow 60 is configured by the insulating member 32 and the cover oxide films 59. The hollow 60 is mainly supported by the insulating member 32 and the silicon pillar 26 that pierce through the hollow 60 in the Z-direction. Subsequently, the cover oxide films 59 are removed.

Figure 13A:
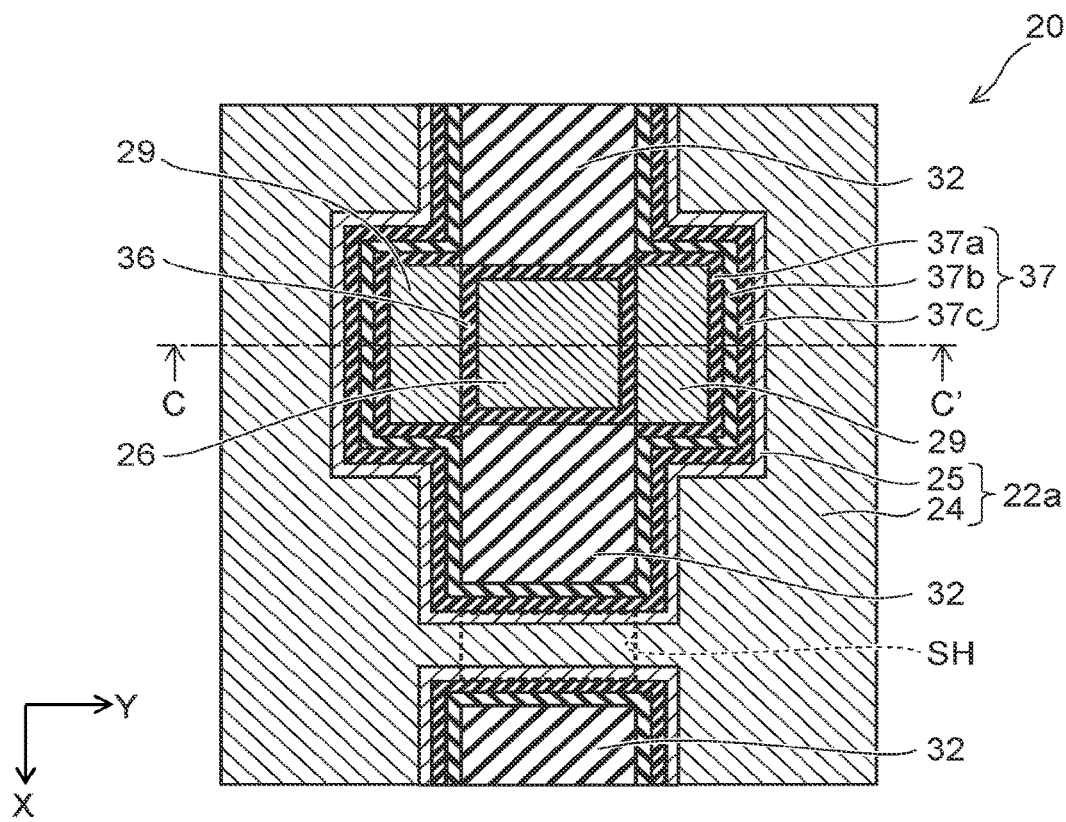
Figure 13B:
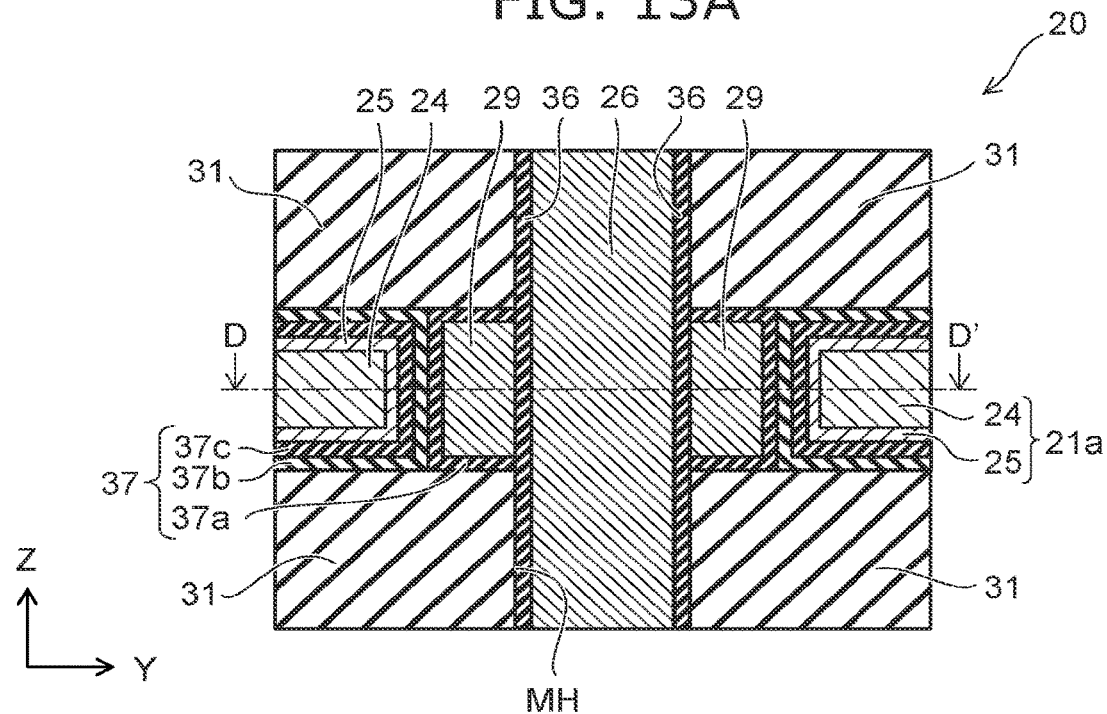

Subsequently, as shown in FIGS. 13A and 13B, by depositing silicon oxide via the through-hole SH with, for example, the ALD method, a silicon oxide layer 37b is formed on the inner surface of the hollow 60. Subsequently, by depositing a high dielectric constant material such as silicon nitride (SiN), hafnium oxide (HfO$_2$), or aluminum oxide (Al$_2$O$_3$) via the through-hole SH, a high dielectric constant layer 37c is formed on the silicon oxide layer 37b. Subsequently, by depositing titanium nitride (TIN) with, for example, the CVD method, a barrier metal layer 25 is formed on the high dielectric constant layer 37c. Subsequently, by depositing tungsten (W) with, for example, the CVD method, the main body section 24 is embedded in the hollow 60.

Subsequently, as shown in FIGS. 4A and 4B, the main body section 24 and the barrier metal layer 25 are etched back via the through-hole SH to remove the main body section 24 and the barrier metal layer 25 from the inside of the through-hole SH. As a result, the main body section 24 and the barrier metal layer 25 are divided in each of spaces among the memory trenches MT. Consequently, the upper selection gate lines 23a, the word lines 22a, and the lower selection gate lines 21a are formed by the main body section 24 and the barrier metal layer 25 disposed among the memory trenches MT. Subsequently, silicon oxide is deposited in the through-hole SH to embed the insulating member 33.

Subsequently, as shown in FIGS. 1 to 3, both the end portions in the X-direction of the stacked body 20 are processed in a step shape to expose end portions of the upper selection gate lines 23a, end portions of the word lines 22a, and end portions of the lower selection gate lines 21a. Subsequently, for example, silicon oxide is deposited to form the interlayer insulating film 30 that embeds the entire stacked body 20 and, at the same time, form the contacts 41 and 45, the intermediate interconnects 42 and 46, the vias 43, the bit line plugs 27, the upper layer interconnects 44, and the bit lines 28. In this way, the semiconductor memory device 1 according to the embodiment is manufactured.

Effects of the embodiment are described.

In the embodiment, the memory trench MT is formed, the floating gate electrodes 29 are formed on the sides of the memory trench MT, and the tunnel insulating film 36 and the silicon pillar 26 are formed in the memory trench MT. Thereafter, the through-hole SH is formed to overlap the memory trench MT, the sacrificial film 51 is removed via the through-hole SH, and the silicon oxide layer 37b, the high dielectric constant layer 37c, the word line 22a, and the like are formed in the formed hollow 60. Therefore, compared with the case where the through-hole SH is formed in a position spaced from the memory trench MT, it is possible to reduce an interval among the memory trenches MT and increase the array density of the memory cells in the Y-direction.

In the embodiment, the memory trenches MT divide the upper selection gate interconnect layer 23 into the plurality of upper selection gate lines 23a. The upper selection gate lines 23a are connected to the upper layer interconnects 44 via the contacts 41, the intermediate interconnects 42, and the vias 43. Therefore, it is possible to drive the upper selection gate lines 23a independently from one another.

On the other hand, the memory trenches MT divide the word line interconnect layer 22 into the plurality of word lines 22a and divide the lower selection gate interconnect layer 21 into the plurality of lower selection gate lines 21a. However, in the block, the word lines 22a are connected to one another and the lower selection gate lines 21a are connected to one another by the intermediate interconnects 46. Consequently, it is possible to drive the word lines 22*a* and the lower selection gate lines 21*a* in block units.

Note that, as the array interval of the through-holes SH is set longer, it is possible to increase the number of silicon pillars 26 in the memory trenches MT. It is possible to improve an integration degree of the memory cells. On the other hand, when the array interval of the through-holes SH is too long, it is difficult to remove the sacrificial film 51 via the through-holes SH and form the silicon oxide layer 37*b*, the high dielectric layer 37*c*, and the barrier metal layer 25. It is also difficult to embed the main body section 24. Therefore, the array interval of the through-holes SH is determined taking into account a requested integration degree of the memory cells and requested productivity.

Second Embodiment

A second embodiment is described.

Figure 14:
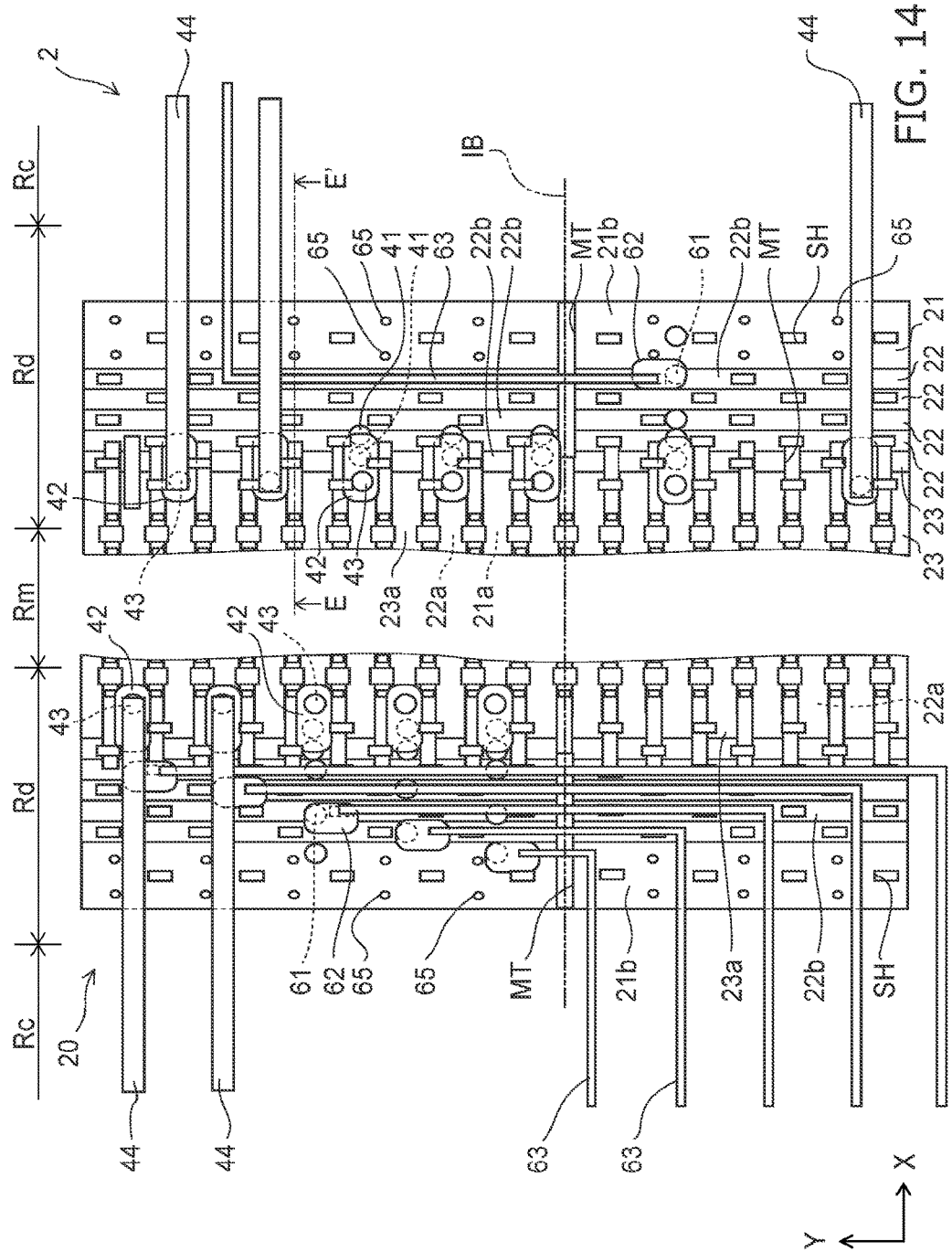
FIG. 14 is a plan view showing a semiconductor memory device according to a second embodiment.

FIG. 14 is a plan view showing a semiconductor memory device according to the embodiment.

Figure 15:
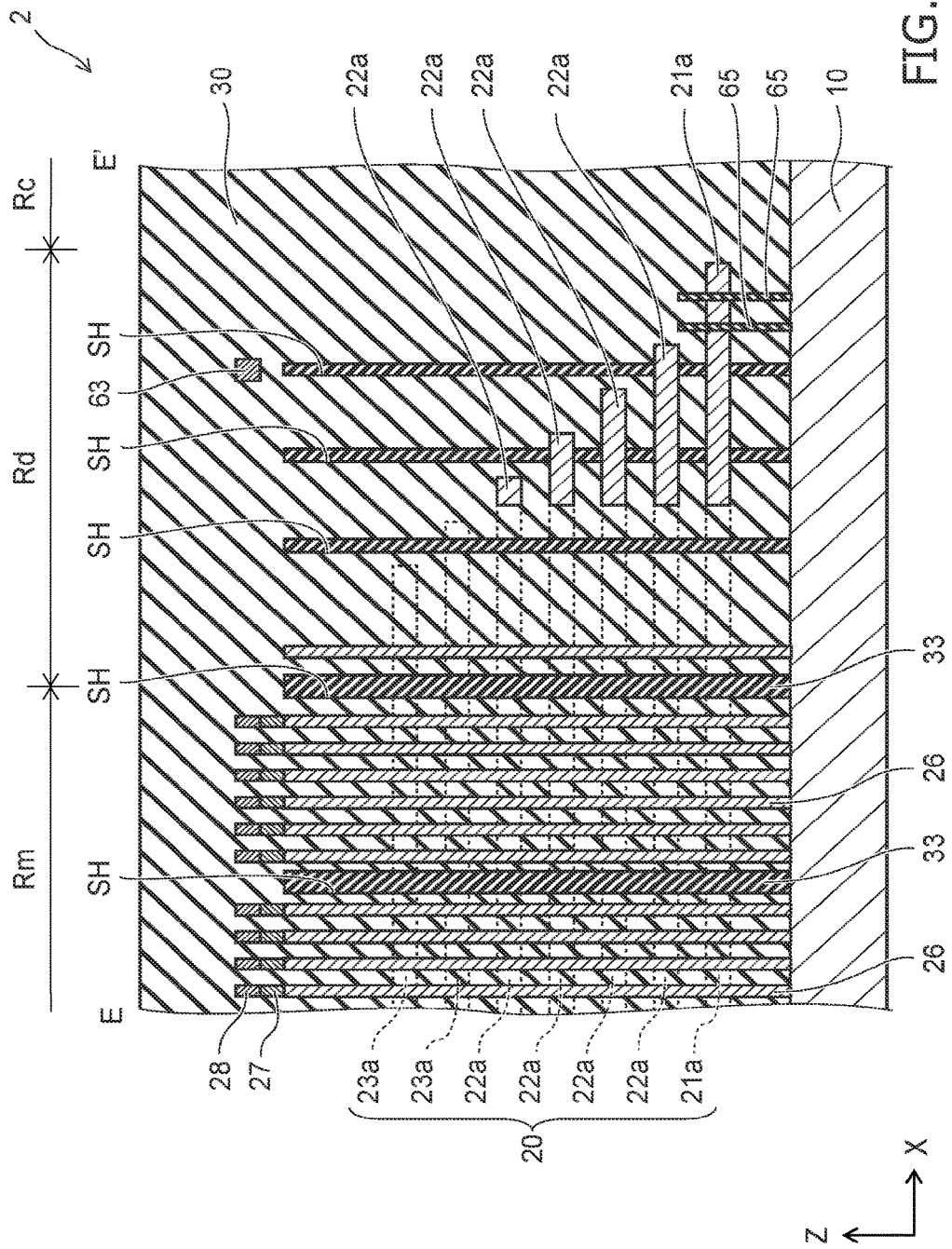
FIG. 15 is a sectional view taken along line E-E' in FIG. 14.

FIG. 15 is a sectional view taken along line E-E' in FIG. 14.

As shown in FIGS. 14 and 15, in a semiconductor memory device 2 according to the embodiment, compared with the semiconductor memory device 1 (see FIG. 1) according to the first embodiment, the memory trenches MT in the blocks are short. Therefore, the memory trenches MT pierce through the stacked body 20 in the Z-direction but do not completely pierce through the stacked body 20 in the X-direction.

As described above, in the stacked body 20, the length in the X-direction of the upper selection gate interconnect layers 23 is smaller than the length in the X-direction of the word line interconnect layers 22 and the lower selection gate interconnect layer 21 which are lower layers than the upper selection gate interconnect layers 23. Therefore, in the embodiment, the memory trenches MT pierce through two upper selection gate interconnect layers 23 in the X-directions but do not pierce through the word line interconnect layers 22 and the lower selection gate interconnect layer 21 in the X-direction. Therefore, the upper selection gate interconnect layers 23 are completely divided by the memory trenches MT. However, the respective end portions in the X-direction of the word line interconnect layers 22 and the lower selection gate interconnect layer 21 are not divided by the memory trenches MT. However, in the boundary lines IB among the blocks, the memory tranches MT completely divide the word line interconnect layers 22 and the lower selection gate interconnect layer 21.

Therefore, the word interconnect layers 22 and the lower selection gate interconnect layer 21 are processed in a ladder shape in the blocks. That is, in the word line interconnect layers 22, both end portions of the plurality of word lines 22*a* extending in the X-direction are integrally coupled to coupling sections 22*b* extending in the Y-direction. The coupling sections 22*b* are end portions in the X-direction remaining without being divided by the memory trenches MT in the word line interconnect layers 22. Similarly, in the lower selection gate interconnect layer 21, both end portions of the plurality of lower selection gate lines 21*a* extending in the X-direction are integrally coupled to the coupling sections 21*b* extending in the Y-direction.

In this way, in the embodiment, in the blocks, the plurality of word lines 22*a* are connected to one another by the coupling sections 22*b*. The plurality of lower selection gate lines 21*a* are connected to one another by the coupling sections 21*b*. Therefore, it is unnecessary to provide the contacts 45 and the intermediate interconnects 46 for each of the word lines 22*a* and the lower selection gate lines 21*a*. One contact 61 and one intermediate interconnect 62 only have to be provided for each of the blocks. In the embodiment, the contact 61 is provided in one of two coupling sections 22*a* of the word line interconnect layers 22. The intermediate interconnect 62 is provided on the contact 61. Lead interconnects 63 are provided at the same height as that of the intermediate interconnect 62. Consequently, the word line interconnect layers 22 are connected to the lead interconnects 63 via the contact 61 and the intermediate interconnect 62. The lead interconnects 63 once extend in the Y-direction starting from connection points to the intermediate interconnect 62 and reach above an adjacent block. Thereafter, the lead interconnects 63 bend at a right angle, extend in the X-direction, and move away from the stacked body 20. The same applies to the lower selection gate interconnect layer 21. In this way, in the two blocks adjacent to each other, the lower selection gate interconnect layer 21 and the word line interconnect layers 22 are drawn around to the adjacent block by the lead interconnects 63 and then drawn out in a direction away from the stacked body 20.

In the semiconductor memory device 2, columns 65 extending in the Z-direction are provided on the silicon substrate 10 to pierce through the coupling section 21*b* of the lower selection gate interconnect layer 21. The columns 65 are formed of a material different from that of the sacrificial film 51, for example, silicon oxide or metal. The word line interconnect layers 22 and the upper selection gate interconnect layers 23 are not disposed in regions right above the columns 65.

Further, in the semiconductor memory device 2, in the blocks of the interconnect lead regions Rd, the through-holes SH are also formed on extended lines of the memory trenches MT, that is, on the outside of the memory trenches MT. The insulating members 33 are also provided in the through-holes SH. In the interconnect lead regions Rd, none of the high dielectric constant layer 37*a*, the silicon oxide layer 37*b*, the high dielectric constant layer 37*c*, and the barrier metal layer 25 is disposed between the insulating member 33 and the main body section 24 of the coupling sections 21*b* and 22*b*. The insulating member 33 is in contact with the main body section 24.

According to the embodiment, the memory trenches MT do not completely divide the word line interconnect layers 22. The end portions in the X-direction of the word lines 22*a* are coupled by the coupling section 22*b*. Consequently, it is unnecessary to provide the contacts 45 and the intermediate interconnects 46. As a result, there is room in a space and a degree of freedom of layout of other interconnects is improved.

According to the embodiment, by providing the columns 65 formed of the material different from that of the sacrificial film 51, as shown in FIGS. 12A and 12B, in a process for removing the sacrificial film 51 via the through-hole SH, the columns 65 are not removed. The columns 65 support the interlayer insulating film 31. Consequently, it is possible to prevent the hollow 60 from collapsing.

Further, in the interconnect lead regions Rd, by forming the through-holes SH in regions where the memory trenches MT are not formed, it is easy to remove the sacrificial film 51 and form the silicon oxide layer 37*b*, the high dielectric constant layer 37*c*, the barrier metal layer 25, and the main body section 24.

Note that, when the columns 65 are formed of an insulating material, even after the end portion of the stacked body 20 are processed in the step shape, the columns 65 may be disposed in positions where the columns 65 pierce through the coupling sections 22b of the word line interconnect layers 22. On the other hand, when the columns 65 are formed of a conductive material, after the end portions of the stacked body 20 are processed in the step shape, it is necessary to dispose the columns 65 in positions where the columns 65 are not in contact with the word line interconnect layers 22.

A configuration, a manufacturing method, an operation, and an effect in the embodiment other than those described above are the same as those in the first embodiment.

Third Embodiment

A third embodiment is described.

Figure 16:
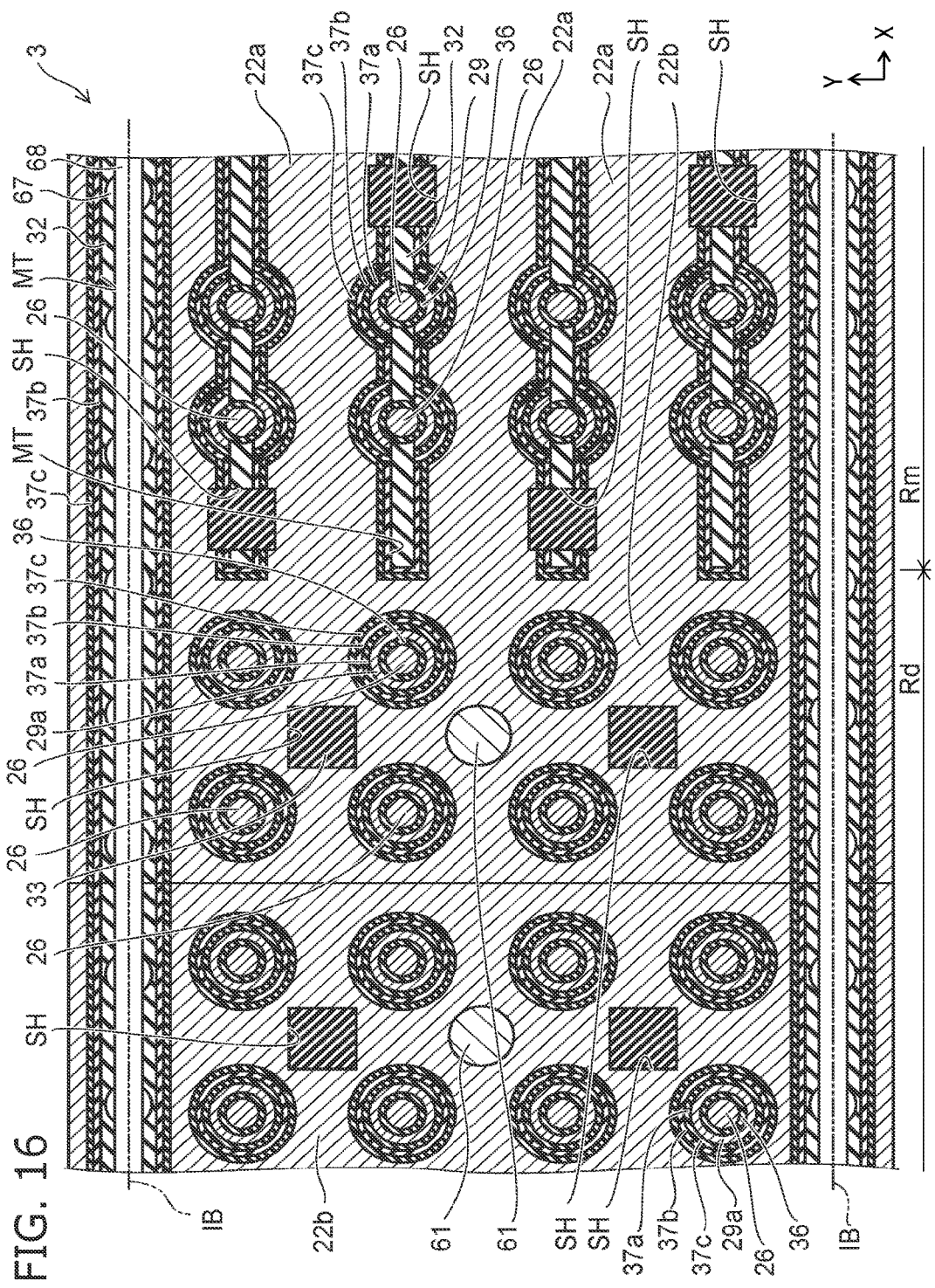
FIG. 16 is a sectional view showing a semiconductor memory device according to a third embodiment.

FIG. 16 is a sectional view showing a semiconductor memory device according to the embodiment.

Note that, in FIG. 16, illustration of the barrier metal layer 25 is omitted.

As shown in FIG. 16, in a semiconductor memory device 3 according to the embodiment, the silicon pillars 26 are provided not only in the memory region Rm but also in the interconnect lead region Rd. Annular floating gate electrodes 29a surrounding the silicon pillars 26 are provided around the silicon pillars 26 disposed in the interconnect lead region Rd. On the other hand, in the memory region Rm, the floating gate electrodes 29 are provided in both sides in the Y-direction of the silicon pillars 26.

In the semiconductor memory device 3, as in the second embodiment, the through-holes SH are also formed in the interconnect lead region Rd. The insulating members 33 are provided in the through-holes SH. However, unlike the second embodiment, the through-holes SH are disposed in positions deviating from extended lines of the memory trenches MT. Further, the contacts 61 are connected to regions where the silicon pillars 26 and the insulating members 33 are not provided in the coupling sections 22b of the word line interconnect layers 22.

In the first embodiment, after the memory trenches MT (see FIG. 6A) extending in the X-direction are formed and the memory trenches MT are filled with the insulating members 32, the memory holes MH are formed by applying the etching using the hard mask for AA and the hard mask for MT (not shown in the figure) disposed in the lattice shape as a mask. Consequently, the memory holes MH in a rectangular shape viewed from the Z-direction are formed.

On the other hand, in the embodiment, as shown in FIG. 16, after the memory trenches MT are formed and the insulating members 32 are embedded in the memory trenches MT, the memory holes MH in a circular shape viewed from the Z-direction are formed by applying the etching using a hard mask for AA (not shown in the figure) in which a plurality of circular openings are formed. At this point, the openings of the hard mask for AA are also formed on the extended lines of the memory trenches MT in the interconnect lead regions Rd. Consequently, the semiconductor memory device 3 according to the embodiment is manufactured.

According to the embodiment, by providing the silicon pillars 26 in the interconnect lead region Rd as well, in the process for forming the hollow 60 shown in FIGS. 12A and 12B, it is possible to support the hollow 60 with the silicon pillars 26. Therefore, unlike the second embodiment, the columns 65 are unnecessary. Note that the silicon pillars 26 and the floating gate electrodes 29a formed in the interconnect lead region Rd do not configure memory cells.

In the semiconductor memory device 3, contacts 67 are provided in the memory trenches MT provided along the boundary lines IB of the blocks. The contacts 67 pierce through the insulating members 32. Lower ends of the contacts 67 are connected to the silicon substrate 10 (see FIG. 2). A common source line 68 extending in the X-direction is provided on the contacts 67 and connected to the upper ends of the contacts 67. Consequently, it is possible to apply source potential to the silicon substrate 10 via the common source line 68 and the contacts 67.

In the embodiment, compared with the second embodiment, it is possible to omit a process for forming the columns 65. Therefore, productivity is high.

A configuration, a manufacturing method, an operation, and an effect other than those in the embodiment are the same as those in the second embodiment.

According to the embodiments described above, it is possible to realize a semiconductor memory device having a high integration degree and a manufacturing method for the semiconductor memory device.

Note that, in the first to third embodiments, the example is described in which the memory holes MH are formed, the tunnel insulating films 36 are formed on the inner surfaces of the memory holes MH, and the silicon pillars 26 are formed on the insides of the memory holes MH, that is, on the side surfaces of the tunnel insulating films 36. However, not only this, but, for example, in the first and second embodiments, tunnel insulating films and silicon films may be formed on both side surfaces of the memory trenches MT. Thereafter, silicon pillars may be formed by dividing the tunnel insulating films and the silicon films along the X-direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
   a plurality of first interconnects extending in a first direction and arrayed along a second direction crossing the first direction;
   a plurality of semiconductor pillars arrayed in a row along the first direction in each of spaces among the first interconnects and extending in a third direction crossing the first direction and the second direction;
   a first electrode disposed between one of the semiconductor pillars and one of the first interconnects;
   a first insulating film disposed between the first electrode and one of the first interconnects; and
   a first insulating member disposed between the semiconductor pillars in the first direction, extending in the third direction and opposed the first interconnects not via the first insulating film.

2. The device according to claim 1, further comprising:
   a substrate disposed on the third direction side when viewed from the first interconnects;
   a plurality of second interconnects disposed between the substrate and the first interconnects and extending in the first direction;

a second electrode disposed between one of the semiconductor pillars and one of the second interconnects; and
a second insulating film disposed between the second electrode and one of the second interconnect, wherein
the semiconductor pillars are disposed in each of spaces among the second interconnects, and
the first insulating member is opposed the second interconnects not via the second insulating film.

3. The device according to claim 2, wherein a distance between an end portion of one of the first interconnect in the first direction and one of the semiconductor pillar is shorter than a distance between an end portion of one of the second interconnect in the first direction and the one of the semiconductor pillar.

4. The device according to claim 1, further comprising a second insulating member disposed between the first interconnects and between the semiconductor pillars and extending in the third direction, wherein
the first insulating film includes:
  a first insulating layer disposed on a side surface opposed to the first interconnect of the first electrode and on an upper surface and a lower surface of the first electrode; and
  a second insulating layer disposed on a side surface opposed to the first electrode of the first interconnect and on an upper surface and a lower surface of the first interconnect,
the first insulating member is opposed the second insulating member via the second insulating layer and not via the first insulating layer.

5. The device according to claim 1, further comprising a third insulating film disposed between one of the semiconductor pillars and the first electrode.

6. The device according to claim 5, wherein the third insulating film is disposed around the one of the semiconductor pillars when viewed from the third direction.

7. The device according to claim 1, further comprising a second insulating member disposed between the first interconnects and between the semiconductor pillars and extending in the third direction, wherein
the first interconnects are spaced from each other by the first insulating member and the second insulating member.

8. The device according to claim 7, further comprising:
an intermediate interconnect extending in the second direction; and
a contact connected between each of the first interconnects and the intermediate interconnect.

9. The device according to claim 7, further comprising:
a substrate disposed on the third direction side when viewed from the first interconnects; and
second interconnects disposed on an opposite side of the substrate when viewed from the first interconnects and extending in the first direction, wherein
the semiconductor pillars are disposed in each of spaces among the second interconnects, and
the second interconnects are spaced from one another.

10. The device according to claim 1, wherein end portions in the first direction of the first interconnects are coupled to each other.

11. The device according to claim 10, further comprising:
a substrate disposed on the third direction side when viewed from the first interconnects;
a plurality of second interconnects disposed between the substrate and the first interconnects and extending in the first direction;
a second electrode disposed between one of the semiconductor pillars and one of the second interconnects;
a second insulating film disposed between the second electrode and one of the second interconnects; and
a column extending in the third direction and piecing through an end portion of one of the second interconnects, wherein
the semiconductor pillars are disposed in each of spaces among the second interconnects,
end portions in the first direction of the second interconnects are coupled to each other, and
the first insulating member is opposed the second interconnects not via the second insulating film.

12. The device according to claim 10, further comprising:
a substrate disposed on the third direction side when viewed from the first interconnects;
a plurality of second interconnects disposed between the substrate and the first interconnects and extending in the first direction;
a second electrode disposed between one of the semiconductor pillars and one of the second interconnects;
a second insulating film disposed between the second electrode and the one of the second interconnects;
another semiconductor pillar piercing through an end portion of one of the first interconnect and an end portion of one of the second interconnect and extending in the third direction; and
annular electrodes disposed between the another semiconductor pillar and one of the first interconnect and between the another semiconductor pillar and one of the second interconnect and surrounding the another semiconductor pillar, wherein
end portions in the first direction of the second interconnects are coupled to each other,
the semiconductor pillars are disposed in each of spaces among the second interconnects, and
the first insulating member is opposed the second interconnects not via the second insulating film.

13. The device according to claim 10, further comprising another first insulating member extending in the third direction and piercing through the end portions coupled to each other of the first interconnects, wherein
the first insulating film is not disposed between the another first insulating member and the first interconnect.

14. The device according to claim 13, wherein the another first insulating member is disposed on an extended line of a row consisting of a plurality of semiconductor pillars arrayed in a row along the first direction.

15. The device according to claim 13, wherein the another first insulating member is disposed in a position deviating from an extended line of a row consisting of a plurality of semiconductor pillars arrayed in a row along the first direction.

16. A manufacturing method for a semiconductor memory device comprising:
alternately stacking interlayer insulating films and first films to form a stacked body;
forming a plurality of trenches in the stacked body, the trenches extending in a first direction and arrayed in a second direction crossing the first direction;
embedding a first insulating member in one of the trenches;
forming first through-holes in one of the trench, the first through-holes being arrayed in a row in the first direction and extending in a third direction crossing the first direction and the second direction;

forming a recessed portion on a side surface of the one of the trenches by etching back one of the first films via one of the first through-hole;

forming a first insulating layer on an inner surface of the recessed portion and forming an electrode in the recessed portion;

forming a first insulating film on an inner side surface of the one of the first through-holes;

forming a semiconductor pillar in the one of the first through-hole;

forming a second through-hole extending in the third direction in a portion embedded by the first insulating member in the one of the trench;

forming a hollow by removing one of the first film via the second through-hole;

forming a second insulating layer on an inner surface of the hollow via the second through-hole;

embedding a conductive material in the hollow via the second through-hole;

removing the conductive material from an inside of the second through-hole; and embedding the second insulating member in the second through-hole.

\* \* \* \* \*